(12) United States Patent
Zajc

(10) Patent No.: US 9,496,857 B2
(45) Date of Patent: Nov. 15, 2016

(54) METHOD AND APPARATUS FOR DRIVING HALF BRIDGE CONNECTED SEMICONDUCTOR POWER SWITCHES WITH A STABLE AND EXTREMELY SHORT INTERLOCK DELAY COMBINED WITH A SWITCHING TRANSITION SPEED INCREASE AND A DRIVING POWER CONSUMPTION REDUCTION

(71) Applicant: Franc Zajc, Medvode (SI)

(72) Inventor: Franc Zajc, Medvode (SI)

( * ) Notice: Subject to any disclaimer, the term of this patent is extended or adjusted under 35 U.S.C. 154(b) by 0 days.

(21) Appl. No.: 14/372,720

(22) PCT Filed: Jan. 17, 2013

(86) PCT No.: PCT/EP2013/050869
§ 371 (c)(1),
(2) Date: Jul. 16, 2014

(87) PCT Pub. No.: WO2013/107832
PCT Pub. Date: Jul. 25, 2013

(65) Prior Publication Data
US 2015/0109033 A1 Apr. 23, 2015

Related U.S. Application Data

(63) Continuation-in-part of application No. 13/351,618, filed on Jan. 17, 2012, now Pat. No. 8,829,949.

(30) Foreign Application Priority Data

Jan. 18, 2012 (EP) ..................................... 12151561

(51) Int. Cl.
*H03K 5/13* (2014.01)
*H03K 4/62* (2006.01)
(Continued)

(52) U.S. Cl.
CPC ................ *H03K 4/625* (2013.01); *H03K 4/64* (2013.01); *H03K 4/90* (2013.01); *H03K 17/302* (2013.01); *H03K 17/691* (2013.01); *H03K 19/017* (2013.01)

(58) Field of Classification Search
CPC ................................................ H03K 19/00315
See application file for complete search history.

(56) References Cited

U.S. PATENT DOCUMENTS

| 5,140,201 A | 8/1992 | Uenishi |
| 8,421,505 B2 | 4/2013 | Nakanishi |

(Continued)

FOREIGN PATENT DOCUMENTS

| CN | 1129373 A | 8/1996 |
| CN | 1838536 A | 9/2006 |

(Continued)

OTHER PUBLICATIONS

Patent Cooperation Treaty, International Search Report, International Patent Application No. PCT/EP2013/050869, mailed Nov. 7, 2013, 3 pages.

(Continued)

*Primary Examiner* — Daniel Puentes
(74) *Attorney, Agent, or Firm* — Fenwick & West LLP

(57) ABSTRACT

A driving circuit for driving half bridge connected electrically controlled power switches with a near zero interlock delay time between on-states of the power switches, wherein the driving circuit is configured to receive an input signal and to generate: —a first drive signal being adapted to switch a first power switch between the on and off state, —a second drive signal being adapted to switch a second power switch between the on and off state, wherein the signal curve of the first drive signal generated in response to a rising and falling edge of said input signal is mirrored with respect to the signal curve of the second drive signal along a time axis of a mirroring voltage value within a transition time, wherein the mirroring voltage value is adjusted such to be within the cutoff region of the power switches.

21 Claims, 21 Drawing Sheets

(51) Int. Cl.
*H03K 17/30* (2006.01)
*H03K 19/017* (2006.01)
*H03K 4/64* (2006.01)
*H03K 4/90* (2006.01)
*H03K 17/691* (2006.01)

(56) References Cited

U.S. PATENT DOCUMENTS

| | | |
|---|---|---|
| 8,829,949 B2 | 9/2014 | Zajc |
| 2006/0170043 A1 | 8/2006 | Liu et al. |
| 2007/0025123 A1 | 2/2007 | Kim et al. |
| 2007/0146020 A1 | 6/2007 | Williams |
| 2009/0278621 A1* | 11/2009 | Kris .................. H02M 1/38 332/109 |
| 2010/0327946 A1 | 12/2010 | Barrenscheen |
| 2011/0025397 A1 | 2/2011 | Wang et al. |

FOREIGN PATENT DOCUMENTS

| | | |
|---|---|---|
| CN | 1849748 A | 10/2006 |
| CN | 1879111 A | 12/2006 |
| CN | 1909372 A | 2/2007 |
| CN | 101147324 A | 3/2008 |
| CN | 201118535 Y | 9/2008 |
| DE | 4110633 A1 | 10/1991 |
| DE | 10351033 A1 | 6/2004 |
| DE | 10061563 B4 | 12/2005 |
| DE | 102009046255 A1 | 5/2010 |
| EP | 0760552 A1 | 3/1997 |
| JP | 200842633 A | 2/2008 |
| WO | WO 02/47265 A2 | 6/2002 |
| WO | WO 2011/119102 A1 | 9/2011 |

OTHER PUBLICATIONS

Balogh, L., "Design and Application Guide for High Speed MOSFET Gate Drive Circuits," Texas Instruments/Unitrode Corporation, Power Supply Design Seminar, SEM, 2001, pp. 1-37.

Callanan, R., "Application of Silicon Carbide MOSFETs," Power Semiconductors, 2011, pp. 39-40, Issue 3.

Chen, Y., "Resonant Gate Drive Techniques for Power MOSFETs," Thesis, Virginia Polytechnic Institute and State University, May 2000, p. 32, p. 64, p. 71.

European Search Report, European Application No. 12151561, Oct. 29, 2013, 2 pages.

"FSFA2100—Fairchild Power Switch (FPS™) for Half-Bridge PWM Converters," Sep. 2008, Fairchild Semiconductor Corporation, pp. 1-16.

Grzesik, B. et al., "1MHz Sinusoidal Gate Driver for Class DE Inverter Operating with Variable Load and Frequency," IEEE, 2000, pp. 817-822.

Meyer, J.M., "Resonant MHz Gate Drive," Master's Thesis, DTU Electrical Engineering, Jul. 18, 2008, p. 24.

Chinese First Office Action, Chinese Application No. 201380014852.X, Jul. 12, 2016, 18 pages.

* cited by examiner

METHOD AND APPARATUS FOR DRIVING HALF BRIDGE CONNECTED SEMICONDUCTOR POWER SWITCHES WITH A STABLE AND EXTREMELY SHORT INTERLOCK DELAY COMBINED WITH A SWITCHING TRANSITION SPEED INCREASE AND A DRIVING POWER CONSUMPTION REDUCTION

TECHNICAL BACKGROUND

The invention relates to a method and a circuit for driving semiconductor power switches, such as Bipolar Junction Transistor (BJT), Metal Oxide Silicium Field Effect Transistor (MOSFET), Silicium Carbide Field Effect Transistor (SiC FET), Galium Nitride Field Effect Transistor (GaN FET) or Junction Field Effect Transistor (JFET) transistors connected in a half bridge HB configuration, which are mainly used as a switch unit to convert power from one form to another in electric motor and generator controlled systems, uninterrupted and interrupted power supplies, voltage DC transmission and in many other conversion applications. Half bridge connection of the power switches controlled with pulse width modulation (PWM) or pulse density modulation (PDM) is a commonly used technique for these applications.

In most conversion applications the half bridge connected power switches switch between both poles of the applied voltage. By alternating the ratio of the conducting time of both power switches and simultaneously setting the duty cycle, the generated output voltage value is defined. The advantage of such a power conversion enables the bidirectional conversion between DC-DC, DC-AC or AC-AC voltage levels theoretically without losses.

Both power switches alternate among two states, namely an on-state and off-state. During the off-state the resistance of the power switch is very high, therefore no load current can flow through it and further no losses are generated, while during the on-state the power switch conducts the load current and the conductive losses are generated due to the internal on-resistance. The value of the internal on-resistance is low enough for the conductive losses to be very low. Changing the states of the individual power switch causes very high losses due to the simultaneity of the operating voltage and the entire load current. Speeding up the state changes reduces the so called switching losses. For the transient time duration the turning-on power switches to over take the entire load current, which in case of the so called hard switch includes also the body diode charge of the second power switch. Accordingly, during a hard switch the switching losses and electro-magnetic interferences EMI increase drastically.

Only one of the two in half bridge connected power switches may be switched on at the same time, since the cross conduction current between the power supply terminals over the power switches would cause a permanent damage to the power switches. In order to prevent any possibility that such a situation can occur the command to turn-on off the second power switch must be performed with an additional minor delay, so-called dead time DT, after the command to turn-off the first power switch. The minimum value of the dead time DT is given by a worst case combination of the driver signal propagation delay and transition time, as well as propagation delay and rise time of the power switches under all possible working conditions, such that a certain time delay, namely interlock delay ID, exists between the executed turn-off of the first power switch and the beginning of the turning-on of the second power switch. The voltage switch between both power switches can be done either by a load inductivity, which constitutes the so called soft switching or by one of the power switches, which constitutes the so called hard switching. The switching type, whether it is a soft or hard switching depends on the load current direction.

Increasing the dead time DT also increases the reliability of the circuit against cross conduction currents, however a longer interlock delay diminishes a switching ratio especially for high switching frequencies and causes distortion of the transmitted signal. During the time of the interlock delay the load current flows via the body diode of one of the two power switches causing additional losses due to worse switching characteristics of the body diode in comparison with the turned-on power switch. A further aspect of a long interlock delay are the charge carriers, which occur in the body diode conducting time. These charge carriers, which form the so called reverse recovery charge in the first power switch are discharged by the second power switch. Such situation is known as hard switching.

A conventional way of reducing such switching losses is by adding an additional resonant circuit allowing a soft switching. In the case that the hard switching is not eliminated the common way of reducing the switching losses is the reduction of the PWM frequency or by providing a circuit having an additional fast diode connected in parallel with the source S and drain D of the power switches PT1 and PT2, which over takes the load instead of the parasitic diode. The reduction of a working PWM frequency can be only useful for the application circuits having a sufficient inductance of the load.

An ideal hard switching with minimum power losses could theoretically be reached in the case of an interlock delay short enough (within 10 nsec range), such that the charge carriers do not form and further no reverse recovery in the hard switch situation can occur. Therefore, the switching losses would be significantly smaller.

In order to follow the trend of decreasing the weight and size of the switching conversion devices increasing the carrier frequencies obligatory. In this way a higher resolution and higher frequencies of the generated output voltage can be achieved. With the switching frequency increase the response time for rapid load changes becomes shorter and operation frequencies high enough even for the modern electro motors and audio class D amplifiers will be achieved.

The state-of-art power switch driving technologies do not reduce the interlock delay such that it becomes short enough to decrease the switching losses to a range which allows to significantly increase the switching frequencies in order to follow the later trend.

STATE OF THE ART

There are two known ways of preventing a simultaneous switching on of power switches connected in a half bridge, wherein the first way is demonstrated in FIG. 24, and the second way is shown in FIG. 26. The FIGS. 25 and 27 show the corresponding time curves.

In the conventional driving circuit for driving half bridge connected power switches the logic circuit Log C shown in FIG. 24 converts the input signal A to driving signals $B_1$ and $C_1$ having the rising edges delayed by the delay unit Del for a pre-set delay time DT. The value of the pre-set dead time DT has to take into account the worst case situation delays of the control lines and the worst case situation delays of the power switches PT1 and PT2 to ensure a positive value of the interlock delay ID between the on-states of the power switches PT1, PT2 during the operation, such that the cross conduction cannot occur. The first output signal $B_1$ of the logic circuit Log C is amplified through a first galvanically isolated driving circuit $DR_1$ and converted by means of a resistor $R_{G1}$ into the signal $P_1$, which switches among the floating supply voltages $V_{s+}'$, $V_{s-}'$ output by the a first power supply DC' and controls the on- and off-states of a first power switch PT1. The second output signal $B_2$ of the logic circuit Log C is amplified through a second driving circuit $DR_2$ and converted by means of a resistor $R_{G2}$ into the signal $P_2$, which switches among the supply voltages $V_{s+}$, $V_{s-}$ out put by the power supply DC' and controls the on- and off-states of a second power switch PT2. The resistors $R_{G1}$ and $R_{G2}$ define the voltage slope and accordingly the speed of the switch execution of the power switches PT1 and PT2. The power switches PT1, PT2 of the circuit as shown in FIG. 24 are formed by power MOSFETs.

FIG. 25 shows the signal diagrams of the signals for the conventional driving circuit according to the state of the art as shown in FIG. 24. The input PWM signal A and output signals $B_1$ and $B_2$ of the logic circuit Log C are demonstrated with logic levels 0 and 1. The signals $B_1$ and $B_2$ are mutually inverted and delayed for the logic propagation delay $t_{lpd}$ with respect to the input PWM signal A. Additionally, each rising edge of the signals $B_2$ and $B_2$ is delayed for the preset dead time DT generated within the delay unit Del. The signals $P_1$ and $P_2$ are delayed for a driving propagation delay $t_{dpd}$ of the driving circuits $DR_1$ and $DR_2$ with respect to the corresponding signals $B_2$ and $B_2$. In FIG. 25 the signals $P_1$ and $P_2$ are shown for the case that the supply voltages $V_{s-}$ and $V_{s-}'$ is connected to the source S of the respective transistor and has a value of 0V, thus the positive voltage control pulses that drive the power switches PT1 and PT2. During the time when the signal $P_1$ is higher than the threshold voltage $V_{th}$ of the first power switch PT1 the first power switch PT1 is on and similarly the second power switch PT2 is on during the time when the threshold voltage $V_{th}$ of the second power switch PT2 is exceeded by the value of the signal $P_2$. The time when none of the two power switches PT1 or PT2 is on is called the interlock delay ID. The variations in the logic propagation delay $t_{lpd}$, the driving propagation delay $t_{dpd}$ and the threshold voltages $V_{th1}$, $V_{tw2}$ of the power switches PT1, PT2 cause a variation of the interlock delay ID. In order to prevent a negative interlock delay ID causing the undesired cross connection the preset dead time DT needs to be long enough and has to take into account worst case situations. To prevent a cross connection situation the state of the art driving circuits use preset dead times DT, which is accordingly to the stated above limited down to at least 50 nsec and mostly over 100 nsec.

FIG. 26 shows an alternative implementation of a driving circuit according to the state of the art without the delay unit Del such that the signal $B_1'$ and $B_2'$ are mutually inverted and amplified via isolated driving circuit $DR_1$ and driving circuit $DR_2$. The summation of the propagation delays $t_{lpd}$ and $t_{dpd}$ of both driving lines are adjusted to be equal. The time difference for a delayed turn-on with respect to the turn-off is defined by the difference of the RC', RC" time constant formed within the circuits $RC_1$ and $RC_2$ when loading (RC') or disloading (RC") the gate-source capacitors of the power switches PT1 and PT2. The driving implementation illustrated in FIG. 26 and the corresponding time curves in FIG. 27 show a cost effective solution, which is useful for low power and low frequency applications with narrower duty cycle range. Since a long turn-on RC' constant causes a slower on switching of the power switches PT1 and PT2 the switching losses are significantly higher. The shown conventional solution often uses the powering via the bootstrap diode $D_{bs}$ as shown in FIG. 26.

The state of the art solution shows several limitations regarding improvements of the switching performance of power switches PT. Consequently the use of higher operating frequencies is limited due to the drastic increase of the switching losses with increasing frequency.

SUMMARY OF THE INVENTION

Accordingly, it is an object of the present invention to provide a method and a circuit for driving half bridge connected semiconductor power switches with a stable and extremely low interlock delay combined with switching transition speed increase and driving power consumption reduction.

This object is achieved by a driving circuit for at least one half bridge connected power switches comprising the features of claim 1.

Accordingly the invention provides a driving circuit for driving half bridge connected electrically controlled power switches with a near zero interlock delay time between on-states of the power switches, wherein the driving circuit is configured to receive an input signal and to generate two driving signals as a response to the rising and falling edge of the input signal, wherein each driving signal is adapted to switch the state of a corresponding power switch on and off and the time curves of the aforementioned driving signals are mirrored with respect to one another along a time axis through a mirroring voltage value within the transition time, wherein the mirroring voltage value is adjusted to be low enough for the power switches to be within the cutoff region.

In a possible embodiment the applied input signal is a pulse width modulated (PWM) signal.

In a possible embodiment the applied input signal is a pulse density modulated (PDM) signal.

In a possible embodiment the driving circuit according to the present invention comprises at least one triggering circuit and at least one ramp generating circuit for controlling each power switch. Each triggering circuit comprises two triggering switches adapted to generate a triggering signal. A first triggering switch fulfills the function of switching the off-state voltage value to the positive DC gate supply voltage value, while the second triggering switch fulfills the function of switching the on-state voltage value to the negative DC gate supply voltage value. The triggering switches can be any electrically controlled switching element or any combination of electrically controlled switching elements. Every even change of the input signal simultaneously triggers the first triggering switch that controls the first power switch and the second triggering switch that controls the second power switch. Every odd change of the input signal simultaneously triggers the second triggering switch that controls the first power switch and the first triggering switch controls the second power switch. The triggering signals of the power switches are further shaped into a drive signal via a ramp generating circuit by forming a slope. Each power switch comprises at least one or any combination of electrically controlled semiconductor switching elements. A switching element or a group of switching elements can be formed for example by a Si MOSFETs, a SiC MOSFETs, a GaN MOSFETs, a SiC JFETs or a SiC bipolar transistors, etc. Every switching element of first power switch is controlled by the first drive signal and every switching element of second power switch is controlled by the second drive signal.

In a possible embodiment of the driving circuit according to the present invention the driving circuit comprises at least one ramp generating circuit for each power switch comprising an energy buffer component formed by an inductivity connected between a common point of triggering switches of the corresponding triggering circuit and the control electrode of the corresponding power switch. The inductivity is adapted to supply a maximum current to the control electrode of a corresponding power switch at the time when the threshold voltage of said power switch is reached. The driving energy stored in said inductivity within the switch time $t_s$ accelerates the switching of said power switch.

In a possible embodiment of the driving circuit according to the present invention a damping resistor adapted to damp a signal sway of the driving signal is connected in parallel to the inductivity.

In a possible embodiment of the driving circuit according to the present invention the driving circuit comprises a gate supply switching circuit and a power supply magnetic circuit. The triggering circuit additionally comprises a DC gate supply circuit. The gate supply switching circuit is configured to:
  receive a gate power ratio control signal,
  receive a DC gate power source voltage,
  generate a signal adapted to carry a gate supply energy and
  adjust the voltage value of the DC gate supply voltages out of the said gate supply circuits by modulating the said DC gate power source voltage with the PWM information of the gate power ratio control signal.

The power supply magnetic circuit comprises at least one transformer and is adapted to ensure a galvanically isolated energy transfer of the gate supply energy from the gate supply switching circuit to the DC gate supply circuits. The DC gate supply circuit comprises at least one half wave rectifier and at least one smoothing capacitor and is adapted to:
  generate one, two or three DC gate supply voltages.
  supply the triggering switches and
  receive energy from a power supply magnetic circuit.
  Each DC gate supply voltage can have a value of 0V.

In a possible embodiment of the driving circuit according to the present invention the driving circuit comprises a temperature influence adapting circuit adapted to:
  receive a temperature information signal,
  generate a gate power ratio control signal,
  set the value of DC gate power source voltage via the DC/DC converter and to
  set the gate power ratio control signal and the DC gate power source voltage with respect to the temperature information such that the value of DC gate supply voltages preserves a constant value of differential voltages over an entire temperature range of temperature information signal.

In a possible embodiment of the driving circuit according to the present invention the magnetic coupling circuit being connected between the at least one ramp generating circuit of the first power switch and the at least one ramp generating circuit of the second power switch is adapted to perform the mirroring between the trigger signals. The magnetic coupling circuit is formed by at least one transformer and is adapted to perform a coupling ratio 1 between the ramp generating circuits of the same power switch and a cooling ratio −1 between the ramp generating circuits of different power switches.

In a possible embodiment of the driving circuit according to the present invention the driving circuit comprises a tap on at least one winding of the magnetic coupling circuit and at least one triggering circuit comprising capping diodes connected to said tap. This additional tap forms an autotransformer function with a coupling ratio between 0.5 and 1. The magnetic coupling circuit is adapted for the mentioned coupling ratio to define a maximum voltage oversway value on the control electrode of the power switch. The magnetic coupling circuit and the capping diodes are adapted to return at least part of the driving energy back to the DC gate supply circuits via the capping diodes.

In a possible embodiment of the driving circuit according to the present invention the driving circuit comprises a differentiating circuit and a magnetic triggering circuit. The differentiating circuit is configured to receive an input signal and to generate pulsed signals. The pulsed signals switch among an active and inactive state and are adapted to control the triggering switches through the magnetic triggering circuit without any additional amplification. The value of the first pulsed signal is during the on state of the input signal set to an active state for a preset time duration at least in response to each rising edge of the input signal. The value of second pulsed signal is during the off state of the input signal set to an active state for the preset time duration at least in response to each falling edge of said input signal. The preset time has either a predetermined value or it is defined simultaneously with respect to a power switch state information in order to ensure a minimal driving power consumption. An additional winding of the magnetic coupling circuit is adapted to generate power switch state information. The magnetic triggering circuit comprises at least one transformer and is adapted to:
  turn on the first triggering switch that controls the first power switch and the second triggering switch that controls the second power switch in response to every odd state change of first pulsed signal,
  turn on the second triggering switch that controls the first power switch and the first triggering switch that controls the second power switch in response to every even state change of first pulsed signal and
  hold the all triggering switches off in response to none of the pulsed signals being in an active state.

In a possible embodiment of the driving circuit according to the present invention the driving circuit comprises at least two bistable circuits adapted to prevent the changes in the conducting state of the power switches for the time when none of the triggering switches is switched on.

In a possible embodiment of the driving circuit according to the present invention the driving circuit comprises at least one shut down circuit adapted to switch off the power switches in response to shut down information received through the signal from the magnetic triggering circuit.

In a possible embodiment of the driving circuit according to the present invention the at least one triggering circuit comprises a diode. The aforementioned diode can be either connected between the DC gate supply circuit and the second triggering switch or between the DC gate supply circuit and the first triggering switch.

In a possible embodiment of the driving circuit according to the present invention the differentiating circuit and the magnetic triggering circuit drive at least four power switches connected into a full bridge within the same driving circuit.

BRIEF DESCRIPTION OF FIGURES

In the following possible embodiments of the method and circuit for driving at least one voltage controlled power switch are described with reference to the enclosed figures.

DETAILED DESCRIPTION OF FIGURES

Figure 1:
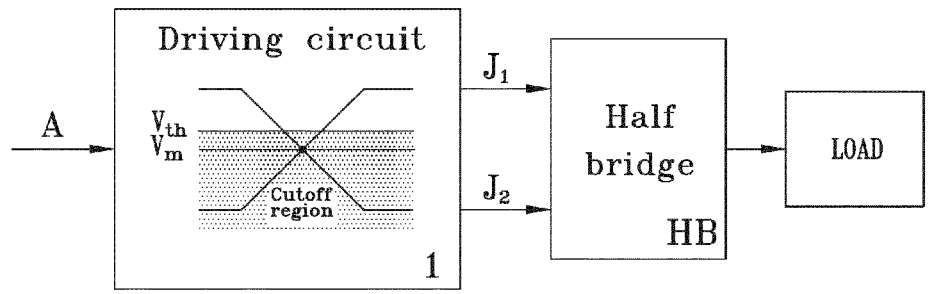
FIG. 1 shows a block diagram of a possible embodiment of a driving circuit for a voltage controlled power switch according to the present invention.

As can be seen in FIG. 1 a driving circuit 1 according to the present invention is provided for driving half bridge connected electrically controlled power switches PT1, PT2 in terms of having a near zero interlock delay (NZID) time between on-states of the power switches PT1, PT2. The interlock delay ID is known as the time interval, which is necessary between switching the load from a first power switch PT1 to a second power switch PT2 and back from the second power switch PT2 to the first power switch PT1 in order to prevent a cross-conduction through the power switches PT1 and PT2. During the interlock delay ID time a body diode $D_B$ conducts a load current $I_L$. The body diode $D_B$ is either a parasitic diode of a power switch PT1,PT2 or a diode connected in parallel of the respective power switch PT1 or PT2. The body diode $D_B$ conducts in a source drain direction of the power switch PT1 or PT2. The load current $I_L$ causes charge carriers to develop within the body diode $D_B$. These charge carriers cause unwanted current spikes when one power switch PT1 or PT2 starts to overtake the load current $I_L$ from the body diode $D_B$ of the other power switch PT2 or PT1. An interlock delay ID under 100 nsec influences the amount of the charge carriers developed in the body diode $D_B$. The lower the interlock delay ID is, the lower is the amount of the developed charge carriers, since there is no time for them to occur. Below an interlock delay ID value of about 10 nsec to 15 nsec the charge carriers do not appear on the body diode $D_B$. The term near zero interlock (NZID) refers to an interlock delay, which is short enough for the charge carriers in the body diode $D_B$ not to occur.

Figure 4:
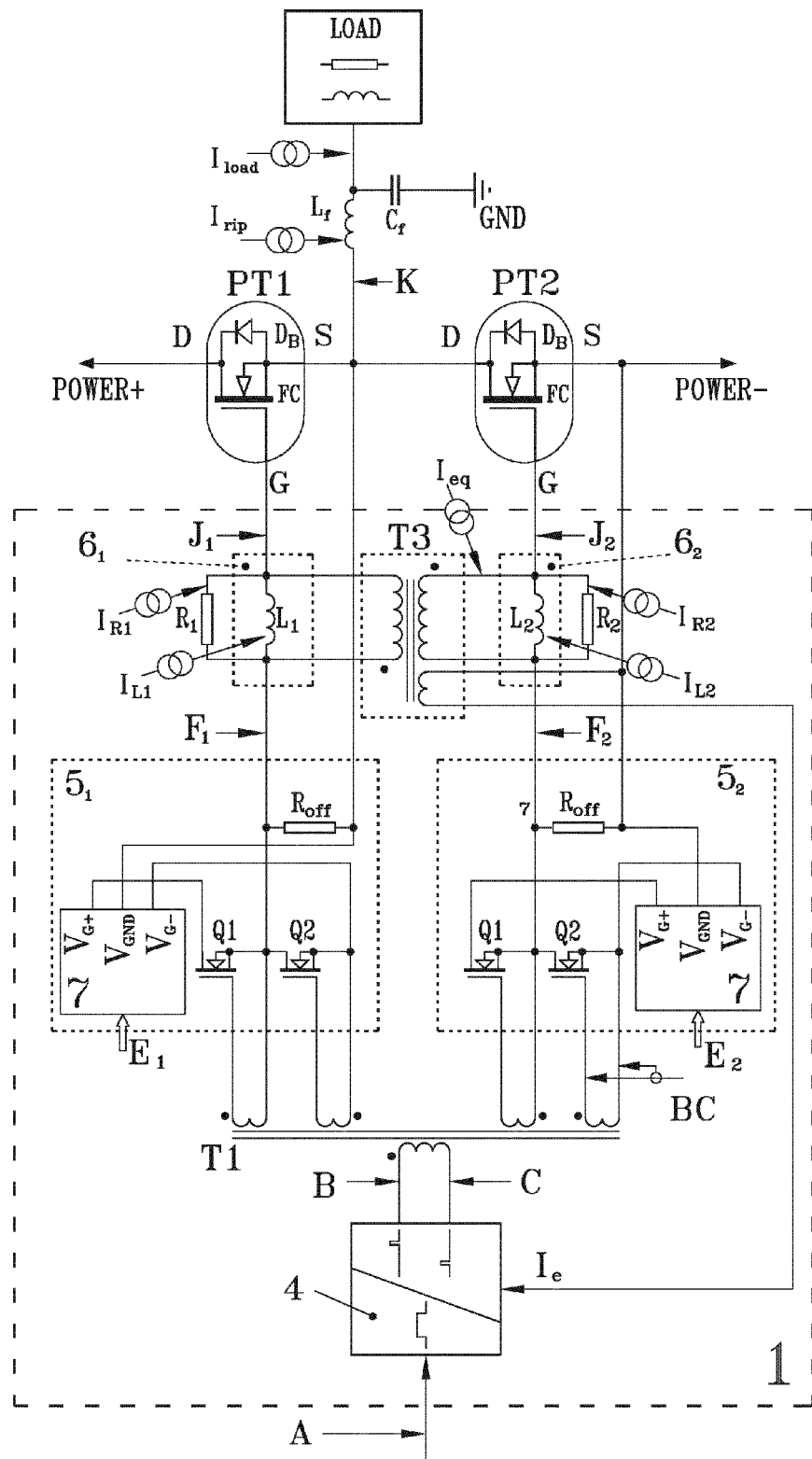
FIG. 4 shows a circuit diagram of a possible embodiment of a driving circuit according to the present invention.
Figure 12:
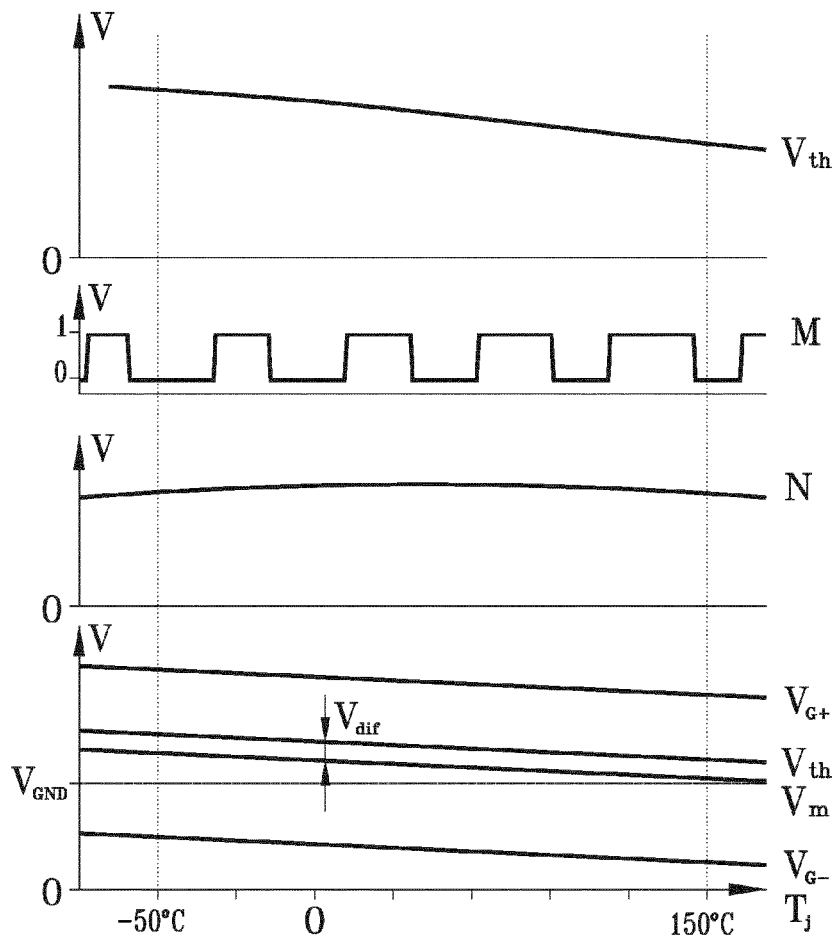
FIG. 12 show signal diagrams for illustrating the operation of temperature influence adapting circuit according to the present invention.

A load can be connected to the output of the half bridge HB. The half bridge HB is formed by the first power switch PT1 and the second power switch PT2. The power switch PT1 and PT2 can be one switching element PT1a, PT1b . . . PT1n, PT2a, PT2b . . . PT2n or a plurality of aforementioned switching elements connected in an arbitrary interconnection, whether parallel, serial or a combination of both. The switching element PT1a, PT1b . . . PT1n, PT2a, PT2b . . . PT2n can be any electrically controlled switching element on a semiconductor basis such as Si, SiC, GaN, . . . as for example MOSFET, BJT, JFET, or any combination of these as for instance IGBT. As shown in FIG. 4 each power switch PT1 and PT2 consists of a FET cell FC and the aforementioned body diode $D_B$. In case the body diode is not integrated into the respective power switch PT1, PT2 an additional diode is connected in parallel to each power switch PT1, PT2, such that the body diode $D_B$ conducts in the source to drain direction as shown in FIG. 12.

The driving circuit 1 shown in FIG. 1 receives an input signal A. The input signal A can for example be a pulse width modulated (PWM) signal or a pulse density modulated (PDM) signal. The driving circuit 1 generates at least one first drive signal $J_1$ and at least one second drive signal $J_2$, that switches between on and off states in response to every rising and falling edge of the input signal A. In the embodiment illustrated in FIG. 1 the first drive signals $J_1$ controls the first power switch PT1 and the second drive signal $J_2$ controls the second power switch PT2. Each switching element PT1a, PT1b . . . PT1n that forms the first power switch PT1 is driven with the drive signals $J_1$ and each switching element PT2a, PT2b . . . PT2n that forms the power switch PT2 is driven with the second drive signals $J_2$.

The on state value of the drive signals $J_1$ and $J_2$ holds the corresponding power switch PT1 or PT2 on. The off state value of the drive signals $J_1$ and $J_2$ holds the corresponding power switch PT1 or PT2 off.

Figure 2:
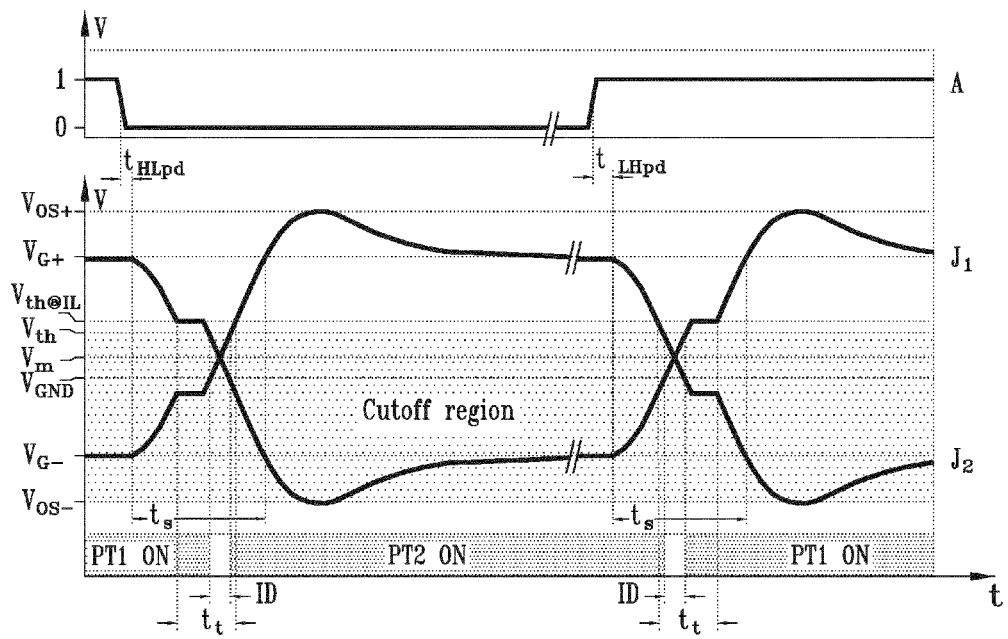
FIG. 2 shows the mirroring function of the driving circuit.

The functionality of the driving circuit 1 is demonstrated by exemplary time curves of an example of a soft and hard switch of a half bridge HB made of Si MOSFET power switches PT1 and PT2 in FIG. 2, wherein the switch waveforms on the left show a soft switching and the switch waveforms on the right show a hard switching. The soft switching occurs when the load current $I_L$ is transferred from the first power switch PT1 to the second power switch PT2 and hard switching occurs when the load current $I_L$ is transferred from the second power switch PT2 to the first power switch PT1. In the possible embodiment of FIG. 2 the first drive signal $J_1$ controls the corresponding first power switch PT1 and the second drive signal $J_2$ controls the corresponding second power switch PT2.

In the embodiment of the FIG. 2 the positive DC gate supply voltage $V_{G+}$ represents the on state value of the drive signals $J_1$ and $J_2$. For the time of the on state value of the drive signals $J_1$ and $J_2$ the corresponding power switch PT1, PT2 is conducting deeply in the ohmic region and is therefore switched on. The negative DC gate supply voltage $V_{G-}$ represents the off state value of the drive signals $J_1$ and $J_2$. For the time of the off state value of the drive signals $J_1$ and $J_2$ the corresponding power switch PT1, PT2 is deep in the cutoff region and is therefore switched off. The cutoff region represents the voltage range of a voltage applied to the control electrode of the power switch PT, which ensures that the respective power switch PT is not conducting.

During the high value of the input signal A the on state value of the first drive signal $J_1$ holds the first power switch PT1 on and the off state value of the second drive signal $J_2$ holds the second power switch PT2 off. In the embodiment according to the FIG. 2 the on state value of drive signals $J_1$ and $J_2$ is the positive DC gate supply voltage $V_{G+}$ and the off state value of drive signals $J_1$ and $J_2$ is the negative DC gate supply voltage $V_{G-}$.

After the stepwise change of the input signal A followed by a high-to-low propagation delay $t_{HLpd}$ the drive signals $J_1$ and $J_2$ start to switch their voltage values. The first drive signal $J_1$ starts decreasing its value from the on state voltage. The first power switch PT1 remains within the ohmic region until the drive signal $J_1$ reaches the load current threshold voltage $V_{th@IL}$. At this point the first power switch PT1 comes into the active region and starts to switch off. The drain source voltage of the first power switch PT1 increases very fast to the DC link voltage being defined by the summation of power source voltages POWER+ and POWER−. This voltage change causes a current through the drain gate capacity $C_{GD}$ of the first power switch PT1 which holds the first drive signal $J_1$ value constant until the time when the drain source voltage of the first power switch PT1 increases to the value of the DC link voltage. This effect is known as the so called Miller effect and appears simultaneously also on the second drive signal $J_2$, as the drain source voltage change occurs also on the second power switch PT2. The second power switch PT2 is meanwhile still deeply in the cutoff region and there are no effects on the state of the second power switch PT2. After the voltage transition on the power switches PT1 and PT2 has been finished the first drive voltage $J_1$ continues to decrease. Simultaneously with the decrease of the first drive voltage $J_1$ the current through the first power switch PT1 starts decreasing and drops to a value 0 A at the time when the first drive voltage $J_1$ becomes equal to the threshold voltage $V_{th}$. The first switch PT1 is off. The first drive voltage $J_1$ keeps decreasing without any further influence to the state of the first power switch PT1. Since the second drive voltage $J_2$ is still in the cutoff region and remains this way until it reaches the threshold voltage $V_{th}$ both power switches PT1 and PT2 are off simultaneously for the interlock delay ID time.

Since the interlock delay ID time is generated automatically by mirroring of the drive signals $J_1$ and $J_2$ it is extremely short and stable. The drive signals $J_1$ and $J_2$ are mirrored with respect to the mirroring voltage value $V_m$ at least for the transition time $t_t$. The transition time $t_t$ represents the time interval in which the value of both drive signals $J_1$ and $J_2$ is lower than the threshold voltage $V_{th}$ of power switches PT1 and PT2, which is ensured by the mirroring voltage $V_m$ being lower than the threshold voltage $V_{th}$ of the power switches PT1 and PT2. Therefore the mirroring voltage Vmis within the so called cutoff region. Within the cutoff region the power switches PT1 and PT2 are turned off.

The slope of the drive signals $J_1$ and $J_2$ and the mirror voltage $V_m$ define the value of the interlock delay ID. The greater the slope is the shorter is the interlock delay ID and vice versa. The value of the interlock delay ID can reach down to 4 nsec while still remaining stable. The most important parameter for the interlock delay ID adjustment is the mirror voltage $V_m$. The value of the mirroring voltage $V_m$ is adjustable as it is defined as the middle voltage between the DC gate supply voltages $V_{G+}$ and $V_{G-}$ that can be controlled via the gate supply switching circuit 10 shown in FIG. 8. This short interlock delay ID prevents any cross-conduction through the power switches PT1 and PT2.

During the time when the second drive voltage $J_2$ increases its value from the threshold voltage $V_{th}$ to the load current threshold voltage $V_{th@IL}$ the load current $I_L$ from the body diode $D_B$ is transferred to the FET cell FC of the second power switch PT2. The second power switch PT2 is turned on. The further increase of the second drive voltage $J_2$ pushes the second power switch PT2 even deeper into the ohmic region.

The shaping of the ramp of the drive signals $J_1$ and $J_2$ is performed by the ramp generating circuit $6_2$ and $6_2$ formed by inductances $L_1$ and $L_2$ as shown in FIG. 4. In the switching time $t_s$ a part of the driving energy is stored in inductances $L_1$ and $L_2$. The switching time $t_s$ is defined as the time between the individual drive signal $J_1$ or $J_2$ changing its value from the on state voltage to the negative DC gate supply voltage $V_{G-}$ or vice versa from the off state voltage to the positive DC gate supply voltage $V_{G+}$. The stored energy extends the slope of the first drive signal $J_1$ under the negative DC gate supply voltage $V_{G-}$ and the slope of the second drive signal $J_2$ over the positive DC gate supply voltage $V_{G+}$ by causing an oversway. The over sway magnitude $V_{OS+}$ and $V_{OS-}$ is in the embodiment shown in FIG. 4 defined by a damping resistors $R_1$ and $R_2$. After the oversway the second drive voltage $J_2$ stays stable at the level of positive DC gate supply voltage $V_{G+}$ and the first drive voltage $J_1$ stays stable at the level of the negative DC gate supply voltage $V_{G-}$ and consequently the second power switch PT2 stays switched on whereas the first power switch PT1 stays switched off.

In the case of the switching shown as the right waveform in the FIG. 2 the drive signals $J_1$ and $J_2$ respond to the rising edge of the input signal A with a low-to-high propagation delay $t_{LHpd}$. The second drive signal $J_2$ starts decreasing its value from the on state voltage. In the voltage range from load current threshold voltage $V_{th@IL}$ to threshold voltage $V_{th}$ the body diode of the second power switch PT2 overtakes the load current $I_L$ from the FET-cell of the power switch PT2. The situation of the conducting states of the power switches PT1 and PT2 stays unchanged for the interlock delay ID time until the rising first drive signal $J_1$ reaches the threshold voltage $V_{th}$.

The value of the interlock delay ID is the same as for the soft switching shown as the left side waveforms in FIG. 2, since the mirroring voltage $V_m$ and the slope defined by inductances $L_1$ and $L_2$ of the drive signals $J_1$ and $J_2$ stay unchanged. Despite the electrical current flowing through the body diode $D_B$ of the second power switch PT2 the short value of the interlock delay ID prevents the charge carriers to occur. Therefore the body diode DB operates as an ideal diode without any reverse recovery effect for the time of the power switch PT1 overtaking the load current $I_L$. The load current $I_L$ overtaking is finished when the first drive signal $J_1$ reaches the load current threshold voltage $V_{th}@I_L$.

The Miller effect occurs. The values of the drive signals $J_1$ and $J_2$ remain unchanged until the drain source voltage at the second power switch PT2 is increased to the DC link voltage and the drain source voltage at the first power switch PT1 falls to $I_L * R_{ds\_onPT1}$. The on resistance $R_{ds\_onPT1}$ of the first power switch PT1 is the drain source resistance of the switched on power switch PT1. The further increase of the first drive voltage $J_1$ pushes the first power switch PT1 even deeper into the ohmic region. The energy stored within the switching time $t_s$ prolongs the slope of the second drive signal $J_2$ under the DC gate supply voltage $V_{G-}$ and the slope of the first drive signal $J_1$ over the DC gate supply voltage $V_{G+}$ by causing an over sway. After the signal over sway the first drive voltage $J_1$ stays stable at the value of the positive DC gate supply voltage $V_{G+}$ and the second drive voltage $J_2$ stays stable at the value of the negative DC gate supply voltage $V_{G-}$ and consequently the first power switch PT1 stays switched on and the second power switch PT2 stays switched off.

The possible difference in propagation delays $t_{HLpd}$ and $t_{LHpd}$ according to the present invention has absolutely no influence on the interlock delay ID value. It only influences the value of the PWM ratio of the output PWM signal K with respect to the input PWM signal A.

Figure 3:
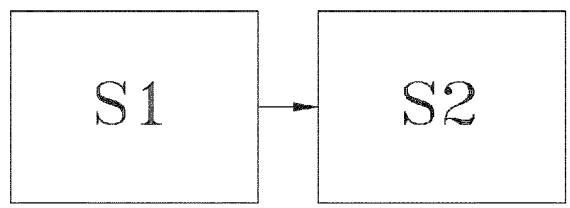
FIG. 3 shows a flow chart of a possible embodiment of a method for driving a voltage controlled power switch according to the present invention.

FIG. 3 shows a flow chart of a possible embodiment of the method for driving a half bridge HB in terms of having a near zero interlock delay NZID time between an on state of the power switches PT1 and PT2 according to the present invention.

In a first step S1 the triggering signals $F_1$ and $F_2$ are generated. A first triggering signal $F_1$ changes as a response to every odd step change of the input signal A its value in a stepwise from an on-voltage state to a positive DC gate supply voltage $V_{G+}$ simultaneously with a second triggering signal $F_2$ which changes as a response to every even step change of the input signal its value in a stepwise from an off-voltage state to a negative DC gate supply voltage ($V_{G-}$).

In the second step S2a shaping of the triggering signals $F_1$ and $F_2$ into the drive signals $J_1$ and $J_2$ is performed. The drive signals $J_1$ and $J_2$ switch the corresponding power switches PT1 and PT2 between the on and off states. The drive signals $J_1$ and $J_2$ are mirrored with respect to one another along the mirroring voltage $V_m$ at least within the transition time $t_r$. The mirroring voltage value $V_m$ is the voltage value applied to the control electrode of the power switches PT1 and PT2 that ensures both power switches PT1 and PT2 to be within the cutoff region. The transition time $t_r$ is defined as the time when none of the power switches PT1,PT2 is in the so-called ohmic region. A power switch is in the ohmic region, when it is driven by a drive signal ($J_1$ or $J_2$) applied to the control electrode being larger as needed for ensuring the conduction of the load current $I_L$. In the case of BJT transistors this region is called saturation.

A possible embodiment of the driving circuit 1 according to the present invention for driving a Si MOSFET is illustrated in FIG. 4. The driving circuit 1 of FIG. 4 comprises a differentiating circuit 4, a magnetic triggering circuit T1, triggering circuits $5_1$ and $5_2$, ramp generating circuits $6_1$ and $6_2$, a magnetic coupling circuit T3 and resistors $R_1$ and $R_2$.

Figure 5:
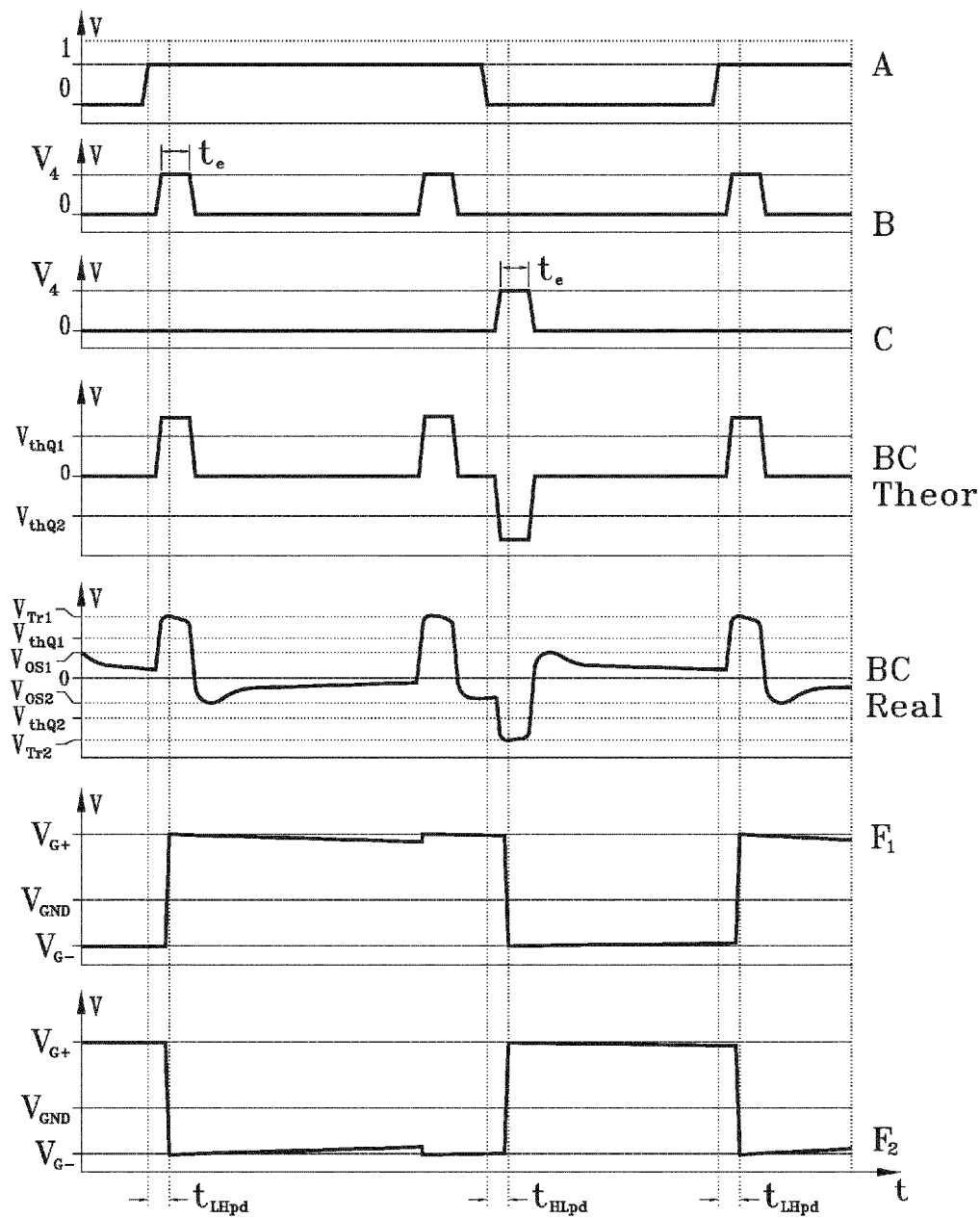
FIG. 5 shows signal diagrams for illustrating the operation of a differentiating circuit according to the present invention.

The input signal A of the driving circuit 1 is connected to the differentiating circuit 4, which generates pulsed signals B and C. The waveforms of the pulsed signals B and C are shown as a signal diagram in the second and third time curve of FIG. 5. A pulse of the pulsed signal B is generated in response to the rising edge of the input signal A and a pulse of the pulsed signal C is generated in response to falling edge of the input signal A. The duration of these pulses is equal to an establishment time $t_e$, which is either predetermined or defined simultaneously with the operation according to a power switch state information $I_{T3}$. In order to prevent a voltage drift of the drive signals $J_1$ and $J_2$ the differentiating circuit 4 can generate maintenance pulses with the same polarity as the last pulse before. Maintenance pulses hold the drive signals $J_1$ and $J_2$ stable for an infinite time, especially in the case of a 0% or 100% duty cycle. A maintenance pulse is shown on the pulsed signal B in the second time curve of FIG. 5. Each pulse of the pulsed signals B and C is amplified within the differentiating circuit 4 to a value, which has to be high enough for the pulsed signals B and C to control the triggering switches Q1 and Q2 through the magnetic triggering circuit T1 without any additional amplification.

The magnetic triggering circuit T1 comprises a transformer with one primary and four secondary windings. Each side of the primary winding is connected to receive a pulsed signal B or C and each secondary winding is connected to one triggering transistor Q1 or Q2 of the triggering circuits $5_1$ and $5_2$. The magnetic triggering circuit T1 converts the pulsed signals B and C to a bipolar trigger signal BC with the magnitude $V_{Tr1}$ and $V_{Tr2}$ being higher than the bipolar threshold voltage $V_{thQ1}$ and $V_{thQ2}$ of a corresponding triggering switch Q1 or Q2. The quality of the magnetic triggering circuit T1 ensures a demagnetization over sway $V_{OS1}$ and $V_{OS2}$ value being lower than the bipolar threshold voltage $V_{thQ1}$ and $V_{thQ2}$. The theoretical waveform of the bipolar trigger signal BC is shown as the fourth time curve of FIG. 5 and the real waveform of the bipolar trigger signal BC is shown as the fifth time curve in FIG. 5. The winding orientation of the magnetic triggering circuit T1 is provided in such a way to ensure that the active state of the pulsed signal B does turn on the first triggering transistor Q1 of the first triggering circuit $5_1$ and the second triggering transistor Q2 of the second triggering circuit $5_2$ simultaneously and to ensure that the active state of the pulsed signal C does turn on the second triggering transistor Q2 of the first triggering circuit $5_1$ and the first triggering transistor Q1 of the second triggering circuit $5_2$ simultaneously.

The triggering switches Q1 and Q2 can be any electrically controlled switching element or a combination of such electrically controlled switching elements. The trigger switches Q1 and Q2 are serial connected and powered via the DC gate supply circuit. The first trigger switches Q1 connect the common point of the trigger switches Q1 and Q2 to the positive DC gate supply voltage $V_{G+}$. The second trigger switches Q2 connect the common point of the trigger switches Q1 and Q2 to the negative DC gate supply voltage $V_{G-}$. The voltage at the common point of the triggering switches Q1 and Q2 of first triggering circuit $5_1$ is the first triggering signal $F_1$. The voltage at the common point of the triggering switches Q1 and Q2 of the second triggering circuit $5_2$ forms the second triggering signal $F_2$. The first triggering signal $F_1$ is shown as the sixth time curve in FIG. 5 and the second triggering signal $F_2$ is shown as the seventh time curve in FIG. 5. The positive DC gate supply voltage $V_{G+}$ represents the on-state voltage of the trigger signals $F_1$ and $F_2$ and the negative DC gate supply voltage $V_{G-}$ represents the off-state voltage of the trigger signals $F_1$ and $F_2$. Both triggering signals $F_1$ and $F_2$ are grounded to a DC gate supply voltage $V_{GND}$ by means of a security resistance $R_{off}$. The simultaneity of the switching of the first triggering switch Q1 of the first triggering circuit $5_1$ and the second triggering switch Q2 of second triggering circuit $5_2$ guaranteed by the magnetic triggering circuit T1 ensures a complementary switch-on of the first triggering signal $F_1$ and switch-off of the second triggering signal $F_2$. The simultaneity of the switching of the second triggering switch Q2 of the first triggering circuit $5_1$ and the first triggering switch Q1 of the second triggering circuit $5_2$ guaranteed by the magnetic triggering circuit T1 ensures a complementary switch-on of the second triggering signal $F_2$ and switch-off of the first triggering signal $F_1$.

The triggering circuits $5_1$ and $5_2$ both include a DC gate supply circuit 7. The DC gate supply circuit 7 supplies DC gate supply voltages $V_{G+}$, $V_{G-}$ and $V_{GND}$ to the triggering switches Q1 and Q2. A first energy $E_1$ powers the DC supply circuit 7 of the first triggering circuit $5_1$ and a second energy $E_2$ powers the DC supply circuit 7 of the second triggering circuit $5_2$.

The security resistance $R_{off}$ ensures that the voltage of the control electrode G is 0V, which in turn ensures that all power switches PT1 and PT2 of the normally off type are switched off and that the turn off of the power switches PT1, PT2 is executed in the absence of the bipolar pulsed signal BC. The security resistance $R_{off}$ causes a voltage drop of the triggering signals $F_1$ and $F_2$ in the time of an inactive bipolar pulsed signal BC. The maintenance pulse returns the dropped voltage value of the triggering signals $F_1$ and $F_2$ back to the previous value.

Figure 6:
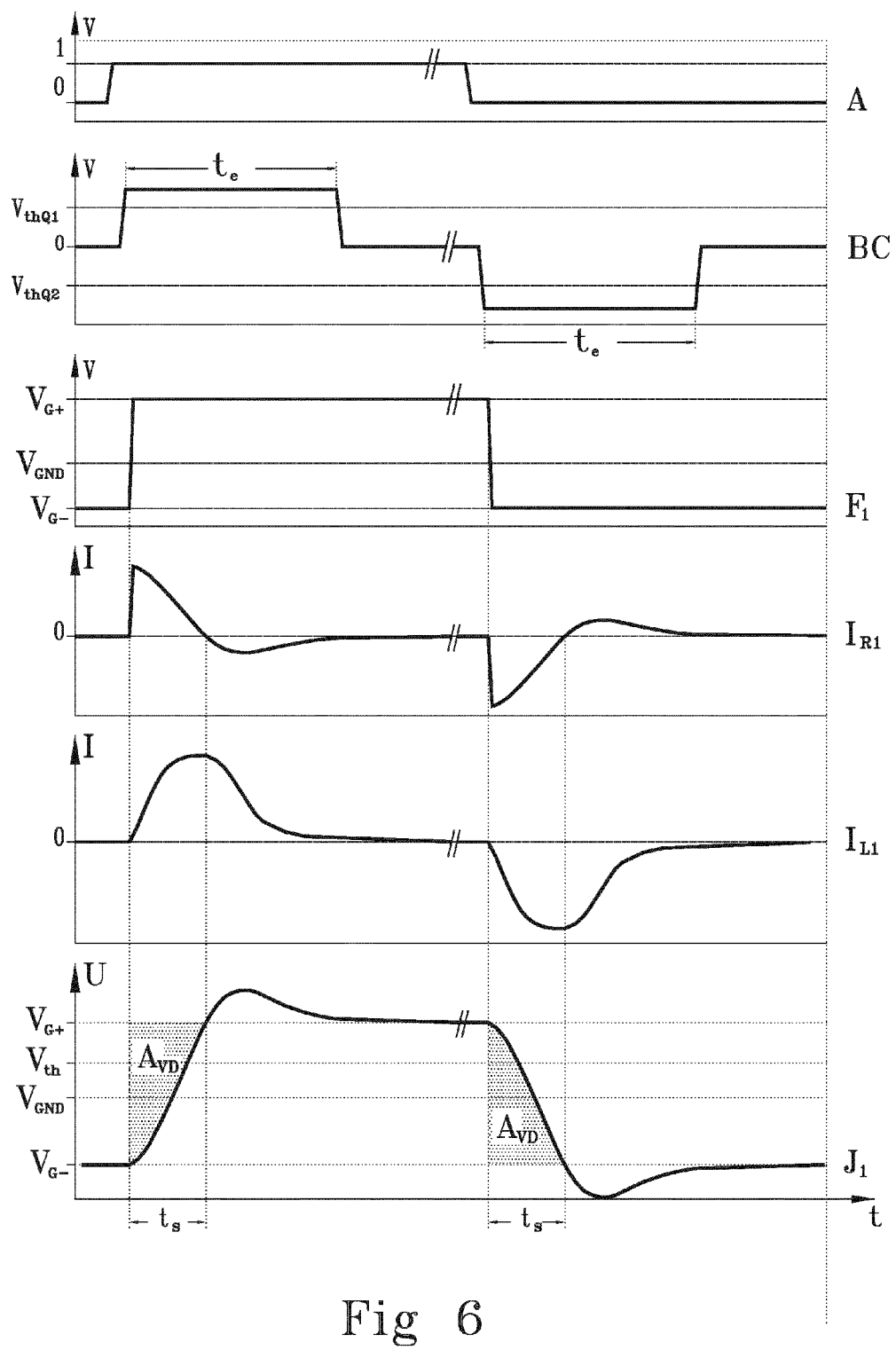
FIG. 6 shows signal diagrams for illustrating the operation of a ramp generating circuit according to the present invention.

Conversion of the first triggering signal $F_1$ into the first drive signal $J_1$ is performed by a corresponding first ramp generating circuit $6_1$, which is formed by an energy buffer component comprising an inductor $L_1$. Conversion of the second triggering signal $F_2$ into the second drive signal $J_2$ is performed by a corresponding second ramp generating circuit $6_2$, which is formed by an energy buffer component comprising an inductor $L_2$. The first drive signal $J_1$ is applied to the control electrode G of the first power switch PT1 and the second drive signal $J_2$ is applied to the control electrode G of the second power switch PT2. The above mentioned conversion of the triggering signals $F_1$ and $F_2$ into corresponding drive signal $J_1$ and $J_2$ causes a difference in the integral of the triggering signal $F_1$ or $F_2$ and the integral of the corresponding drive signal $J_1$ or $J_2$. The first drive signal $J_1$ and the voltage difference area $A_{VD}$ are shown as the sixth time curve of FIG. 6. The stepwise change of the triggering signal $F_1$ or $F_2$ causes a voltage difference on the corresponding inductor $L_1$ or $L_2$ with a maximum value of the voltage difference of the stepwise change of the triggering signal $F_1$ or $F_2$, which drops to 0V within the switching time $t_s$. Therefore a current $I_{L1}$, $I_{L2}$ through the corresponding inductor $L_1$, $L_2$ starts increasing and after that the switching time $t_s$ reaches a maximum value. The maximum values of currents $I_{L1}$ and $I_{L2}$ are defined by the voltage difference area $A_{VD}$ and the corresponding inductor $L_1$ or $L_2$. The inductor current $I_{L1}$ is shown as the fifth curve of FIG. 6.

The energy stored in the inductors $L_1$ and $L_2$ due to the corresponding current $I_{L1}$ and $I_{L2}$ generates an over sway on the corresponding drive signals $J_1$ or $J_2$. A first resistor $R_1$ is connected in parallel to the first ramp generating circuit $6_1$ and a second resistor $R_2$ is connected in parallel to the second ramp generating circuit $6_2$ in order to prevent the rising of the corresponding drive signal $J_1$ and $J_2$ after the over sway. The resistor current $I_{R1}$ is shown as the fourth curve of FIG. 6.

In order to ensure a precise mirroring of the drive signals $J_1$ and $J_2$ the mirroring of the voltage difference between the triggering voltage $F_1$ and the first drive voltage $J_1$ with respect to the voltage difference between the triggering voltage $F_2$ and the second drive voltage $J_2$ is performed by means of a magnetic coupling circuit T3. In the possible embodiment of FIG. 4 the magnetic coupling circuit T3 is formed by one transformer having its primary winding connected in parallel to the first ramp generating circuit $6_1$ and having its secondary winding connected in parallel to the second ramp generating circuit $6_2$. The primary to secondary winding ratio is −1. The mirroring is performed by an equalizing current $I_{eq}$ flowing through the magnetic coupling circuit T3 windings during the time when one of the triggering switches Q1 or Q2 of both triggering circuits $5_1$ and $5_2$ conduct in any direction. Equal values of the inductance of the inductors $L_1$ and $L_2$ as well as equal values of the resistance of the resistors $R_1$ and $R_2$ reduce the equalizing current $I_{eq}$ through the magnetic coupling circuit T3.

Figure 7:
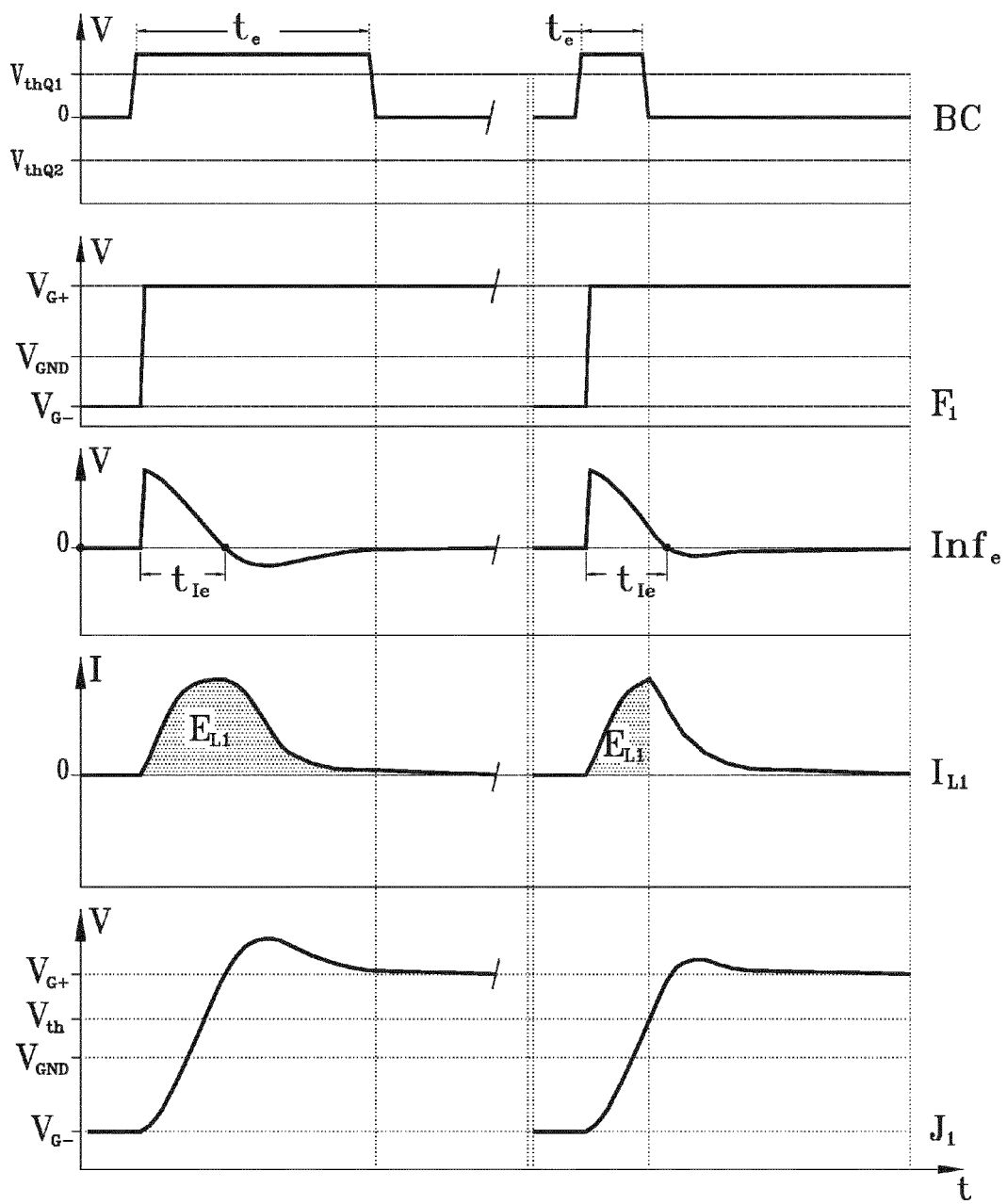
FIG. 7 shows signal diagrams for illustrating reduction of driving energy consumption of the driving circuit according to the present invention.

Through an additional winding of the magnetic coupling circuit T3 the establishment status information $Inf_e$ is transferred to the differentiating circuit 4. The additionally winding represents the voltage on the ramp generating circuits $6_1$ and $6_2$, which forms simultaneously the establishment status information $Inf_e$. Thus, the establishment status information is an indicator of the current switch state of the corresponding power switch PT1 or PT2. A significant information about the switching status is the time $t_{le}$ in which the establishment status information $Inf_e$ reaches a value 0 after having reached its maximum value. By having the establishment time $t_e$ larger than the time $t_{le}$ the driving energy $E_{L1}$ or $E_{L2}$ needed for the switching execution is higher than in the case of having the establishment time $t_e$ shorter than the time $t_{le}$. The over sway value after time $t_{le}$ represents the oversway in the drive signals $J_1$ and $J_2$. By shortening the establishment time $t_e$ the over sway can be hold in proper ranges without provision of corresponding resistors $R_1$ and $R_2$. FIG. 7 shows a comparison of a large establishment time $t_e$ on the left and a short establishment time $t_e$ on the right side. The first time curve in FIG. 7 shows a bipolar pulsed signal BC with a marked up establishment time $t_e$. The second time curve in FIG. 7 shows the first triggering signal $F_1$. The third time curve in FIG. 7 shows an establishment time information $Inf_e$ with a marked up time $t_{le}$. The fourth time curve in FIG. 7 shows the current $I_{L1}$ with a marked up driving energy $E_{L1}$. The fifth time curve in FIG. 7 shows the first drive signal $J_1$.

Figure 8:
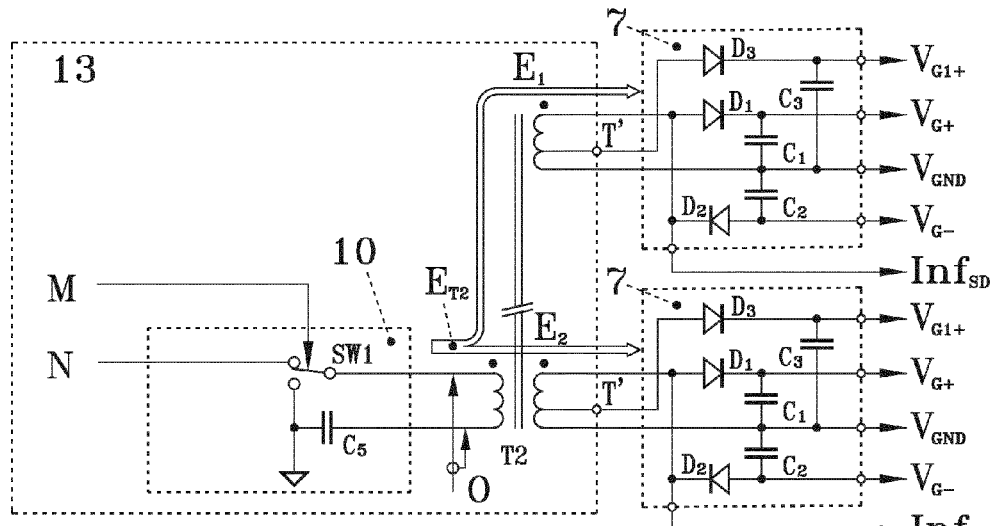
FIG. 8 shows a circuit diagram of a possible embodiment of powering of the driving circuit according to the present invention.

The energy for driving the power switches PT1 and PT2 is supplied via the powering circuit 13 as shown in FIG. 8. The powering circuit 13 comprises at least a supply switching circuit 10 and a power supply magnetic circuit T2. The gate switching circuit 10 generates a signal O by switching a gate power source voltage N by means of a switch SW1 in a ratio defined by a gate power ratio control signal M. The coupling capacitor $C_5$ prevents the power supply magnetic circuit T2 to saturate. The signal O carries an energy $E_{T2}$, which is transferred through the magnetic coupling circuit T2 to the DC gate supply circuits 7. The amplitude of the signal O is defined by the magnitude of the gate power source voltage N. The PWM ratio of the signal O is defined by the duty cycle of the gate power ratio control signal M. A bigger duty cycle of the gate power ratio control signal M simultaneously lowers the positive DC gate supply voltage $V_{G+}$ and increases the negative DC gate supply voltage $V_{G-}$ and vice versa a lower duty cycle of the gate power ratio control signal M simultaneously increases the positive DC gate supply voltage $V_{G+}$ and reduces the negative DC gate supply voltage $V_{G-}$. This is ensured by the power supply magnetic circuit T2 due to its property of equalizing the positive voltage integral areas Φ1 and Φ2 and the negative voltage integral areas Φ1' and Φ2' of the signal O. The amplitude and the PWM ratio of signal O defines the value of the DC gate supply voltages $V_{G+}$ and $V_{G-}$. The values of the DC gate supply voltages $V_{G+}$ and $V_{G-}$ have both a linear dependency of the gate power source voltage N. Apparently, by controlling the values of the gate power ratio signal M and the gate power source voltage N the DC gate supply voltages $V_{G+}$ and $V_{G-}$ can be adapted.

Figure 9:
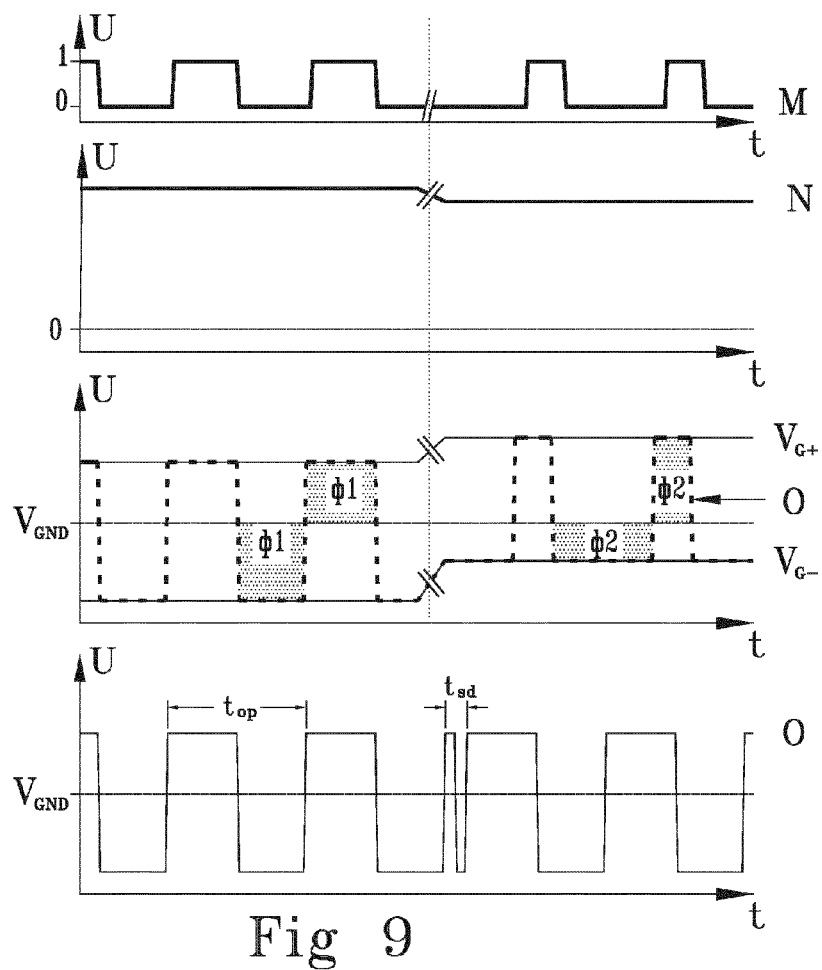
FIG. 9 show signal diagrams for illustrating the operation of the powering of the driving circuit according to the present invention.

FIG. 9 shows the time diagrams of two examples of setting the DC gate supply voltages $V_{G+}$ and $V_{G-}$. Both examples are shown separately with a dotted line. On the left side of the dotted line an example of a bigger duty cycle of the gate power ratio signal M and a higher value of the gate power source voltage N is shown. On the right side of the dotted line an example of a smaller duty cycle of the gate power ratio signal M and a lower value of the gate power source voltage N is shown. The first time curve of the FIG. 9 shows the gate power ratio signal M, the second time curve of the FIG. 9 shows gate power source voltage N and the third time curve of the FIG. 9 shows the signal O with illustrated DC gate supply voltages $V_{G+}$ and $V_{G-}$ as a response of the corresponding gate power ratio signal M and the corresponding gate power source voltage N.

A detailed schematic diagram of the DC gate supply circuit 7 is illustrated in FIG. 8. Each DC gate supply voltage $V_{G1+}$, $V_{G+}$, $V_{G-}$, $V_{GND}$ is generated by one half wave rectifier $D_1$ or $D_2$ or $D_3$ and a corresponding smoothing capacitor $C_1$ or $C_2$ or $C_3$. The DC gate supply voltages $V_{G+}$ and $V_{G-}$ are powered though the same winding. In order to generate the DC gate supply voltage $V_{G+}$ an additional tap T' on the corresponding secondary winding of the power supply magnetic circuit T2 is used.

Figure 15:
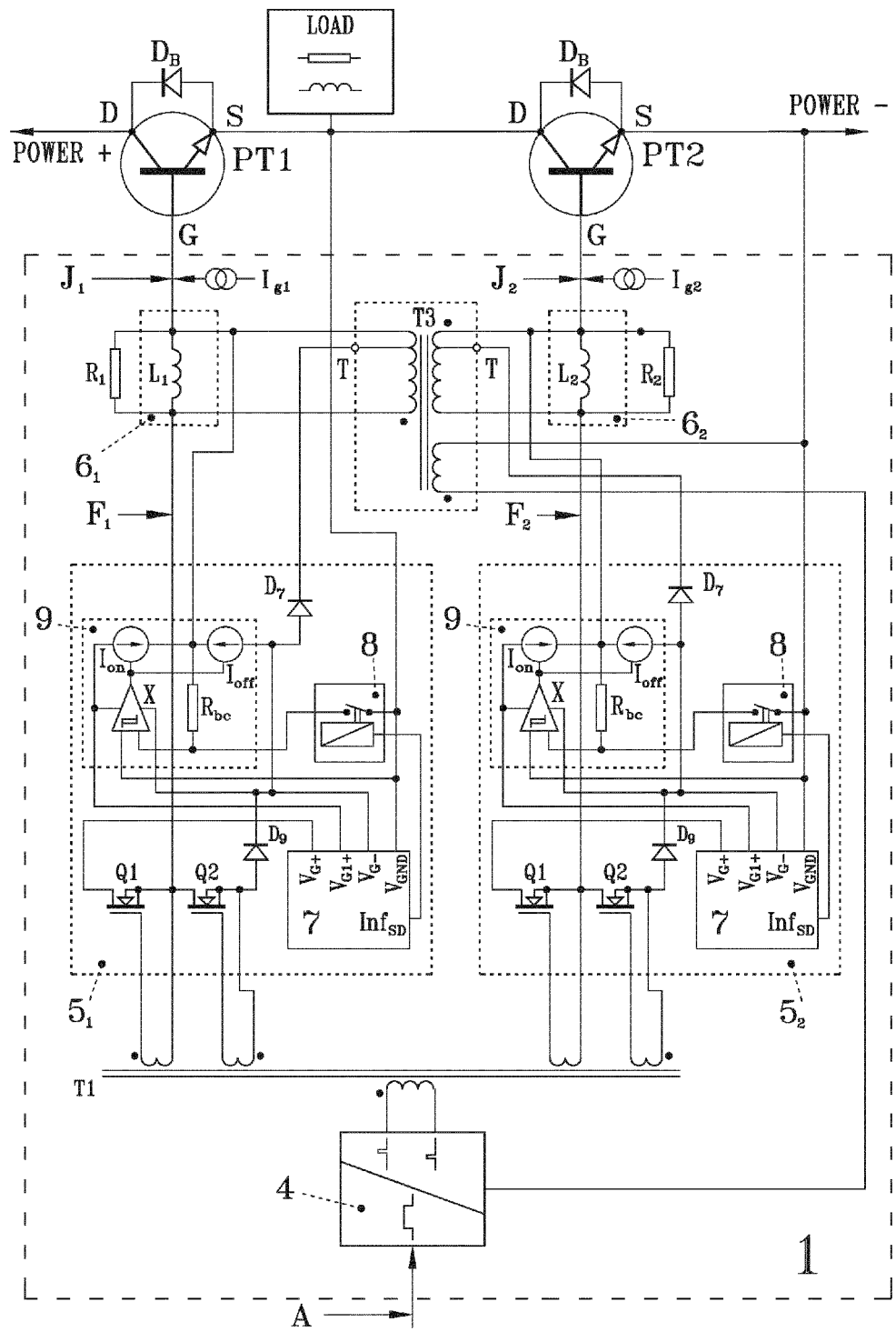
FIG. 15 shows a circuit diagram of a possible embodiment of driving circuit according to the present invention for driving a BJT.
Figure 16:
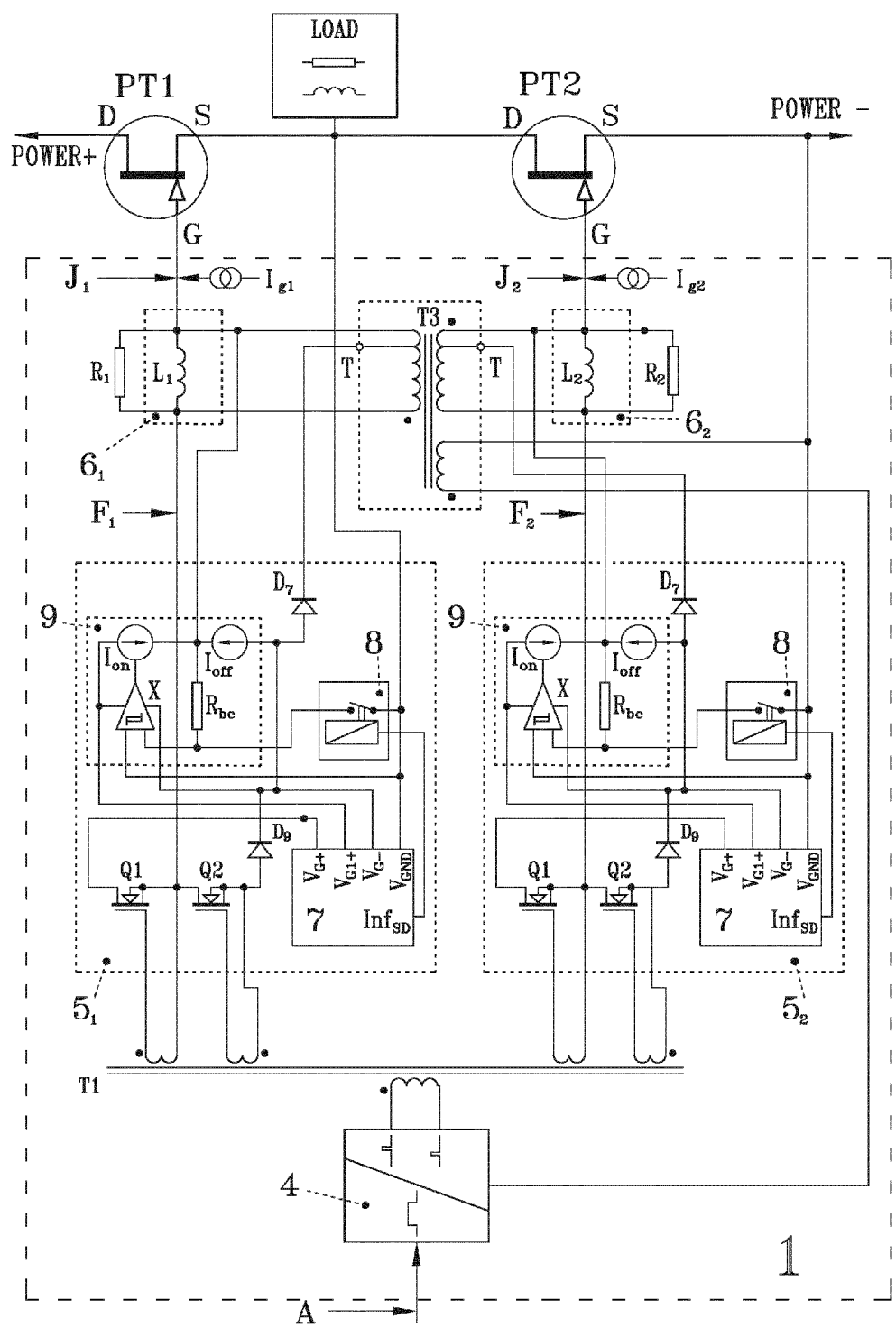
FIG. 16 shows a circuit diagram of a possible embodiment of driving circuit according to the present invention for driving a normally off JFET.

The signal O voltage output by the secondary winding of the power supply magnetic circuit T2 is used to define a shut down information $Inf_{SD}$. In the possible embodiment as illustrated in the fourth time curve in FIG. 9a signal is generated through the gate power ratio control signal M causing a change of the frequency with the same PWM ratio at least for one period of the signal O. An operating period time $t_{op}$ reduces to a shut down period time $t_{sd}$, which is detected by the shut down circuit 8. The connection of the shut down circuit 8 is shown in FIGS. 15-16.

Figure 10:
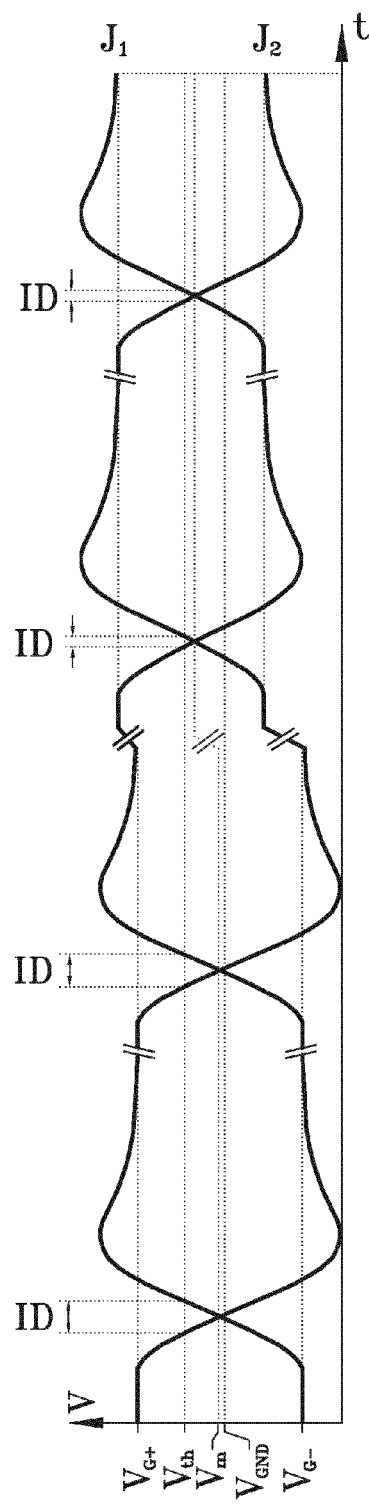
FIG. 10 shows signal diagrams for illustrating the interlock delay dependency according to the present invention.

By setting the values of the gate power ratio control signal M and the gate power source voltage N the DC gate source voltages $V_{G+}$ and $V_{G-}$ and consequently also the average voltage value of the DC gate source voltages $V_{G+}$ and $V_{G-}$, namely the mirroring voltage $V_m$ is defined. Setting of the DC gate source voltages $V_{G+}$ and $V_{G-}$ and the mirroring voltage $V_m$ is limited by the condition that the mirroring voltage $V_m$ needs to be below the threshold voltage $V_{th}$ value. The greater the difference between the mirroring voltage $V_m$ and the threshold voltage $V_{th}$ is the greater is the interlock delay ID value and vice versa, the smaller the difference between the mirroring voltage $V_m$ and the threshold voltage $V_{th}$ is the smaller is the interlock delay ID value. The time curves of the drive signals $J_1$ and $J_2$ in FIG. 10 of one possible embodiment show the difference in the interlock delay ID for two different values of the DC gate supply voltages $V_{G+}$ and $V_{G-}$.

Figure 11:
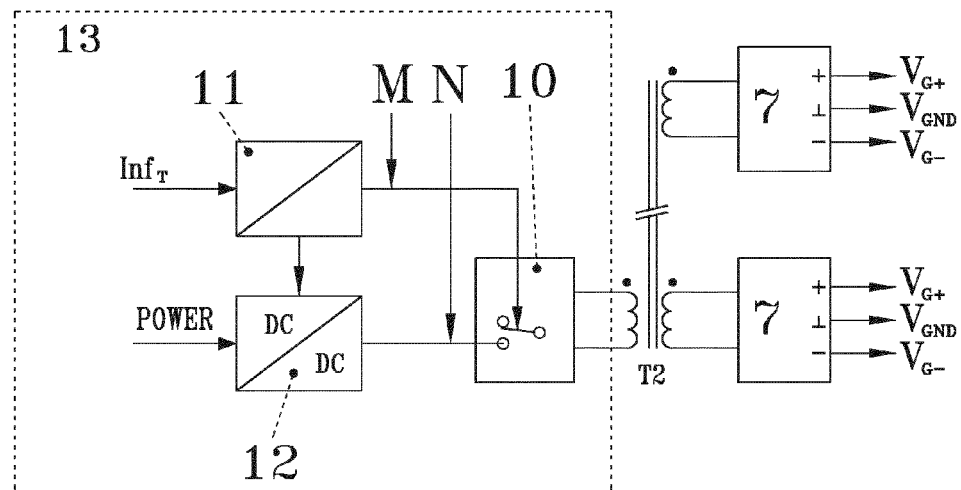
FIG. 11 shows a circuit diagram of a possible embodiment of temperature influence adapting circuit according to the present invention.

FIG. 11 shows a possible embodiment of a circuit which ensures a stable interlock delay ID regardless the temperature changes of the power switches PT1 and PT2. With the temperature increase a drop in the threshold voltage $V_{th}$ occurs as shown in the first time curve of FIG. 12. Therefore the mirroring voltage $V_m$ needs to change with the same voltage difference over the entire temperature range of the power switches PT1 and PT2.

In the possible embodiment shown in FIG. 11 a temperature influence adapting circuit 11 and a DC/DC converter is added to the powering circuit 13. In order to achieve a constant voltage difference $V_{dif}$ despite the variations in a junction temperature $T_j$ of the power switches PT1 and PT2 the temperature influence adapting circuit 11 adjusts the gate power ratio control signal M and controls a DC/DC converter 12 so that the DC/DC converter 12 generates a gate power source voltage N with respect to a temperature information $Inf_T$. The voltage difference $V_{dif}$ is the voltage difference between the mirroring voltage $V_m$ and the threshold voltage $V_{th}$. The temperature information $Inf_T$ includes an information about the junction temperature $T_j$ of the power switches PT1 and PT2.

The first time curve in FIG. 12 illustrates a possible example of the threshold voltage $V_{th}$ dependence on the junction temperature $T_j$. The second and third time curves in FIG. 12 show the gate power ratio control signal M and the gate power source voltage N as a response to the temperature information $Inf_T$ with respect to the junction temperature $T_j$. The fourth time curve in FIG. 12 shows the voltage difference $V_{dif}$, which is constant throughout the entire junction temperature $T_j$ range of the power switches PT1 and PT2 and the corresponding DC gate supply voltages $V_{G+}$ and $V_{G-}$ that ensure such a constant voltage difference $V_{dif}$.

In the possible embodiment of the FIGS. 13a-13d an energy return for on switching of the first power switch PT1 is demonstrated and in FIGS. 14a-14d an energy return for off switching of the first power switch PT1 is demonstrated. Only the elements that are included in the energy transfer of the first power switch PT1 are shown. The circuit in FIGS. 14a-14d has an additional tap T and additional capping diodes $D_6$ and $D_7$ added with respect to the part of the driving circuit 1 that controls the first power switch PT1 in the embodiment shown in FIG. 4. The magnetic coupling circuit T3 has an additional tap T on the winding connected to inductor $L_1$ of the first ramp generating circuit $6_1$ to form an autotransformer function. The position of the tap T is set closer to the side of the winding, which is connected to the control electrode G of the first power switch PT1 and forms a coupling ratio $R_{C<1}$ between 0.5 and 1. The capping diode $D_6$ is connected to the tap T to receive the DC gate supply voltage $V_{G+}$ of the DC gate supply circuit 7. The capping diode $D_7$ is connected between the negative DC gate supply voltage $V_{G-}$ of the DC gate supply circuit 7 and the tap T.

Figure 13A:
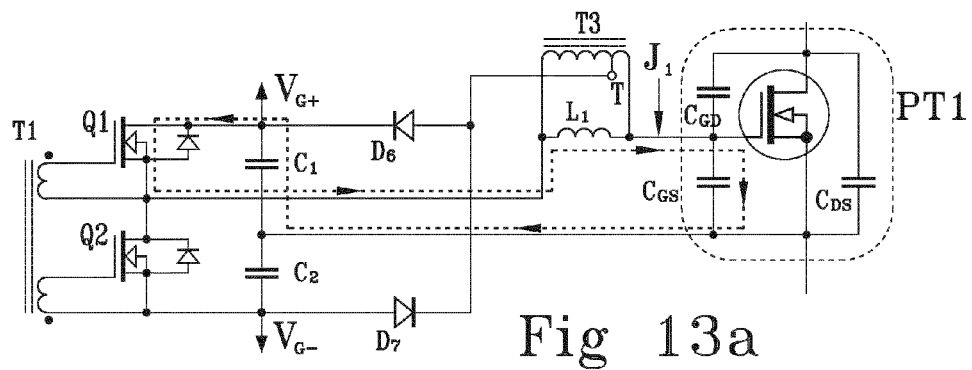
FIGS. 13a,b,c,d shows a current flow for the energy returning during the on switching of the power switch.
Figure 13B:
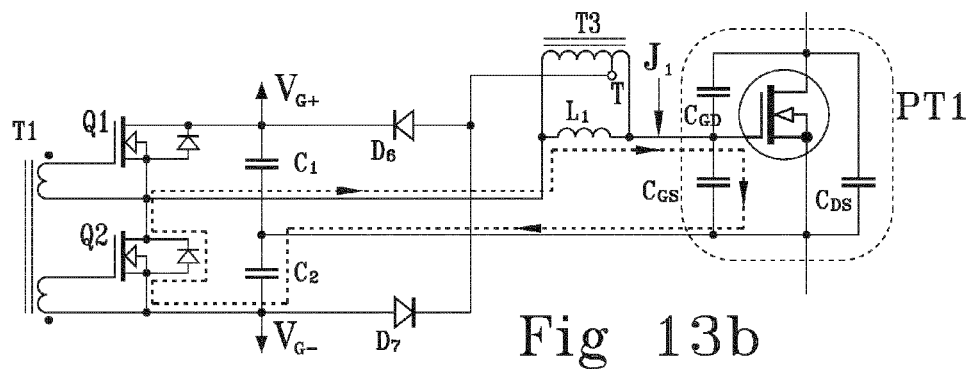
Figure 13C:
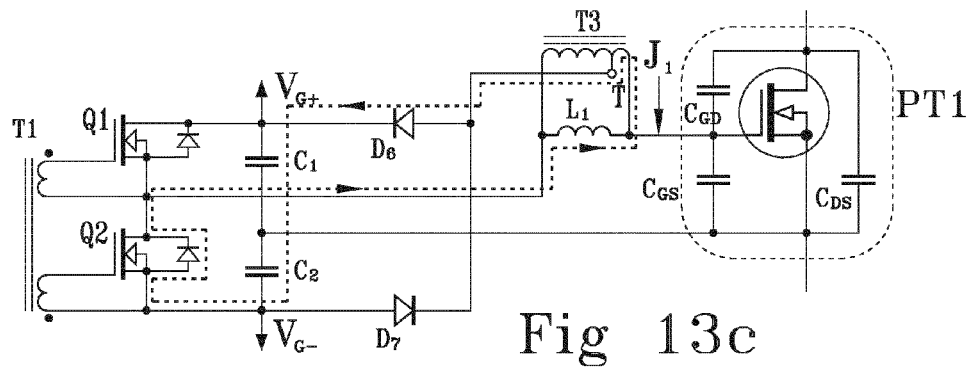
Figure 13D:
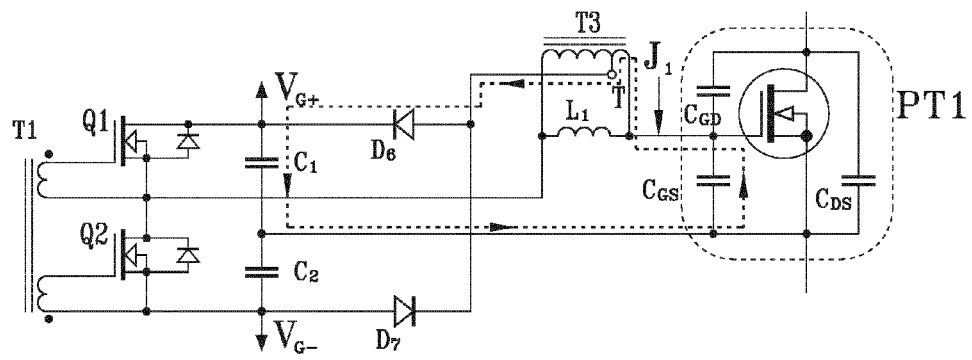

In the possible embodiment shown in FIG. 13a in the establishment time $t_e$ duration the triggering switch Q1 is switched on and a gate current $I_{G1}$ transfers the driving energy from the smoothing capacitor $C_1$ to capacitor $C_{GS}$. As the gate current $I_{G1}$ flows via the inductor $L_1$ the value of the energy stored in the inductor $L_1$ is equal to the value of the energy stored in the capacitor $C_{GS}$. After the triggering switch Q1 has switched off as shown in FIG. 13b the gate current $I_{G1}$ still flows due to the energy stored in the inductor $L_1$ within the establishment time $t_e$. The energy is transferred from inductor $L_1$ to the capacitor $C_{GS}$ and the smoothing capacitor $C_2$. The part of the energy that is returned to the smoothing capacitor $C_2$ is the energy, which is returned back to the DC power supply circuit 7. With the drive signal $J_1$ voltage value reaching the DC gate supply voltage $V_{G+}$ divided by the coupling ratio $R_{C<1}$ the gate current $I_{G1}$ drops to 0 and the energy, which is still stored in the inductor $L_1$ is transferred through the capping diode $D_6$ to the smoothing capacitors $C_1$ and $C_2$ of the DC power supply circuit 7 as shown in FIG. 13c. After the entire energy in the inductor $L_1$ has been transferred the energy stored in capacitor $C_{GS}$ due to the oversway is returned back to the smoothing capacitor $C_1$ of the DC gate supply circuit 7 through the capping diode $D_6$ as shown in FIG. 13d.

Figure 14A:
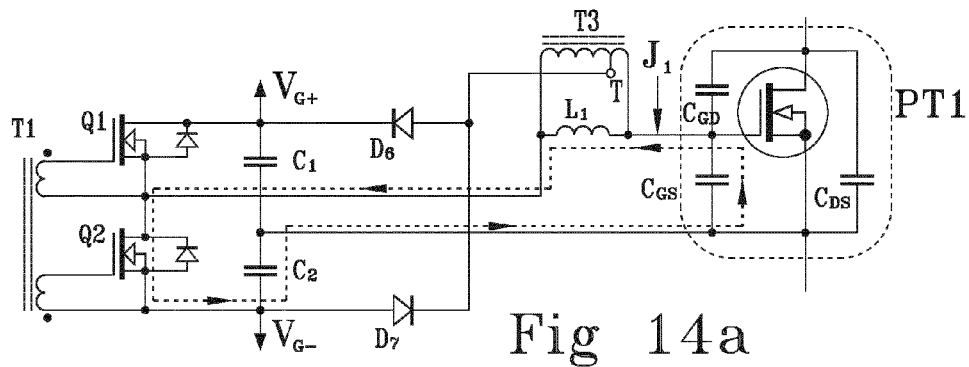
FIGS. 14a,b,c,d shows a current flow for the energy returning during the off switching of the power switch.
Figure 14B:
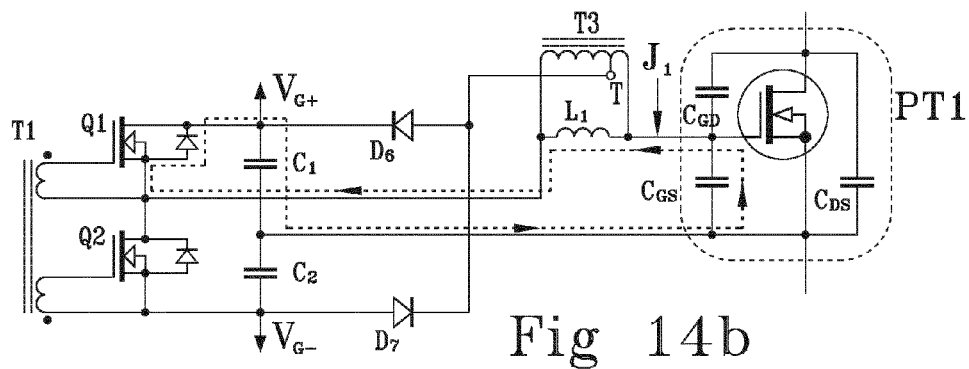
Figure 14C:
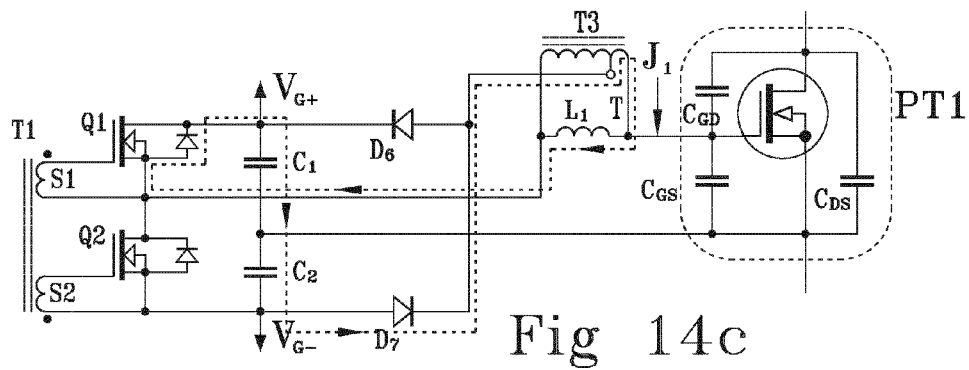
Figure 14D:
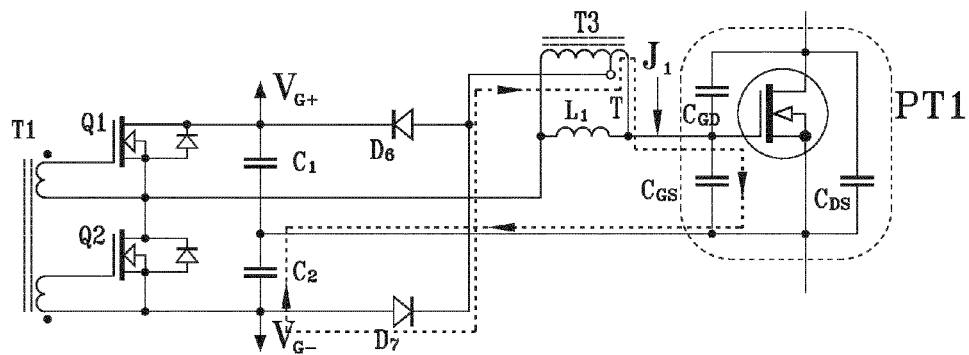

In the possible embodiment shown in the FIG. 14a in the establishment time $t_e$ duration the triggering switch Q2 is switched on and a gate current $I_{G1}$ transfers the driving energy from smoothing capacitor $C_2$ to capacitor $C_{GS}$. As the gate current $I_{G1}$ flows via the inductor $L_1$ the value of the energy stored in the inductor $L_1$ is equal to the value of the energy stored in the capacitor $C_{GS}$. After the triggering switch Q2 has switched off as shown in FIG. 14b the gate current $I_{G1}$ still flows due to the energy stored in the inductor $L_1$ within the establishment time $t_e$. The energy is transferred from inductor $L_1$ to capacitor $C_{GS}$ and the smoothing capacitor $C_1$. The part of the energy that is returned to the smoothing capacitor $C_1$ is the energy, which is returned back to the DC power supply circuit 7. With the drive signal $J_1$ voltage value reaching the DC gate supply voltage $V_{G+}$ divided by the coupling ratio $R_{C<1}$ the gate current $I_{G1}$ drops to 0 and the energy, which is still stored in the inductor $L_1$ is transferred through the capping diode $D_7$ to the smoothing capacitors $C_1$ and $C_2$ of the DC power supply circuit 7 as shown in FIG. 14c. After the entire energy in the inductor $L_1$ has been transferred the energy stored in capacitor $C_{GS}$ due to the oversway is returned back to the smoothing capacitor $C_2$ of the DC gate supply circuit 7 through the capping diode $D_7$ as shown in FIG. 14d.

In a possible embodiment the power switches PT1 and PT2 are formed by switching elements such as BJTs or JFETs, which demand a constant current into the control electrode G to hold the power switch PT1 and PT2 on or off.

FIG. 15 shows a possible embodiment of the driving circuit 1 driving the half bridge HB connected BJTs as power switches PT1 and PT2. FIG. 16 shows a possible embodiment of the driving circuit 1 driving the in half bridge HB connected JFETs as power switches PT1 and PT2. In the possible embodiments of the FIGS. 15 and 16 a bistable circuit 9 is connected to the triggering circuits $5_1$ and $5_2$ in order to provide a constant current flowing to the control electrode G of the power switches PT1 and PT2. The bistable circuit 9 is powered via the DC gate supply circuit 7 with the DC gate supply voltages $V_{G1+}$ and $V_{G-}$ and consists of two current generators Ion and $T_{off}$, a comparator X and a bistable circuit resistor $R_{bc}$. The comparator X has a hysteresis of approximately 1V with respect to DC gate supply voltage $V_{GND}$. At the time the drive signals $J_1$ and $J_2$ being within the hysteresis area the comparator X does not switch the current generators $I_{on}$ or $T_{off}$ on. At the time when the drive voltage is over the hysteresis the comparator X switches the current generator $I_{on}$ on and at the time when the drive voltage is below the hysteresis the comparator X switches the current generator $I_{off}$ on. A bistable circuit resistor $R_{bc}$ is added in the feedback loop of the comparator X to prevent the current reduction at the time when the shut down circuit is turned on. The current generator $I_{on}$ is powered via the DC gate supply circuit 7 with the DC gate supply voltage $V_{G1+}$ and generates a preset current value needed to hold the on-state of the corresponding power switch PT1 and PT2. The position of the tap T' on the secondary winding of the power supply magnetic circuit T2 defines the minimum value of the DC gate supply voltage $V_{G1+}$ that still holds the voltage drop on the current generator $I_{on}$ high enough for the current generator $I_{on}$ to be able to generate the preset current in all working condition. A recommended voltage drop on the current generator $I_{on}$ is up to 2 V. The current generator $I_{off}$ is powered via the DC gate supply circuit 7 with the negative DC gate supply voltage $V_{G-}$ and generates a current needed to hold the off-state of the corresponding power switch PT1 and PT2. The current generated by the current generator $I_{off}$ is predefined and has a value within the mA region and can therefore be replaced with a resistor.

For a fast turning off of the power switches PT1 and PT2 a shut down circuit 8 is added to the triggering circuits $5_1$ and $5_2$. The shut down circuit 8 includes a decoding circuit, which detects a change in the frequency of the signal O and as a response to a detected shut down period time $t_{sd}$ deactivates the bistable circuit 9, connects the corresponding drive signal $J_1$ or $J_2$ to the DC gate supply voltage $V_{GND}$ and consequently turns the corresponding power switch PT1 or PT2 off.

In a possible embodiment in FIG. 15 the driving circuit 1 controls BJTs as power switches PT1 and PT2, therefore the on state voltage $V_{PT1on}$ and $V_{PT2on}$ is lower than the DC gate supply voltage $V_{G+}$ due to the properties of the BJTs. At the time the triggering switch Q2 switches on a voltage difference between the DC gate supply voltage $V_{G-}$ and on state voltage $V_{on}$ occurs on the corresponding ramp generating circuit $6_1$ or $6_2$. At the time the triggering switch Q1 switches on a voltage difference between the DC gate supply voltage $V_{G+}$ and the off state voltage $V_{on}$ occurs at the corresponding ramp generating circuits $6_1$ or $6_2$. The short circuit current through the magnetic coupling circuit T3 due to the voltage difference that thus occurs between ramp generating circuit $6_1$ or $6_2$ is prevented by a blocking diode $D_9$ added to the triggering circuits $5_1$ and $5_2$ between the triggering switch Q2 and the negative DC gate supply voltage $V_{G-}$ of the DC gate supply circuit 7. Only an energy return through the capping diode $D_7$ is possible. Therefore only the capping diode $D_7$ is used for the energy return to the DC power supply circuit 7. The part of energy stored in the inductors $L_1$ and $L_2$ during the establishment time $t_e$ is only returned to the DC gate supply circuit 7, which belongs to the second power switch PT1 or PT2 that is turning off. Therefore the driving energy $E_{L1}$ is during the switch off of the power switch PT2 transferred through the magnetic coupling circuit T3 and the driving energy $E_{L2}$ is during the switch off of the first power switch PT1 transferred through the magnetic coupling circuit T3.

Figure 17:
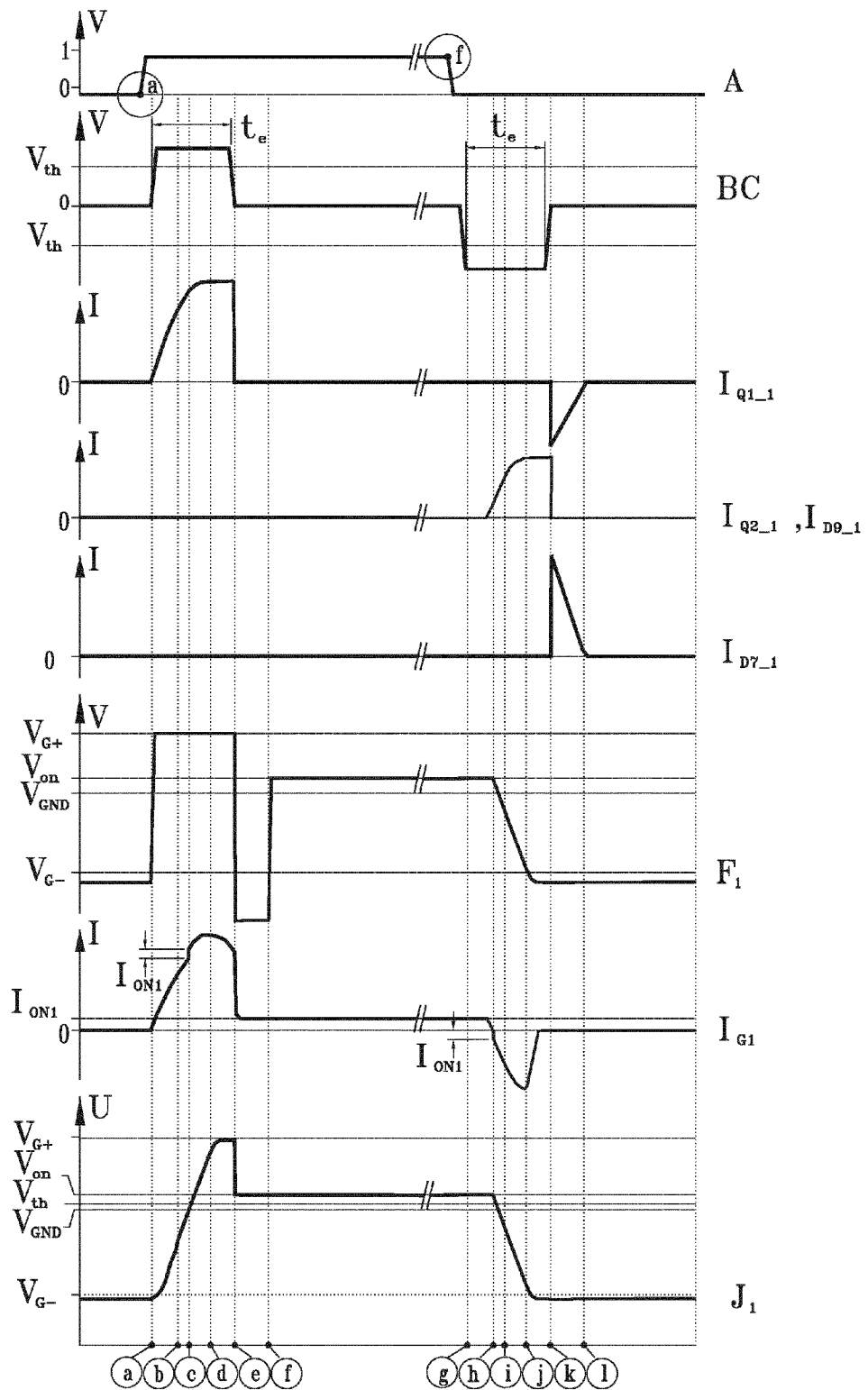
FIG. 17 show signal diagrams for illustrating the operation of driving circuits according to the present invention shown on FIGS. 14-15.
Figure 18:
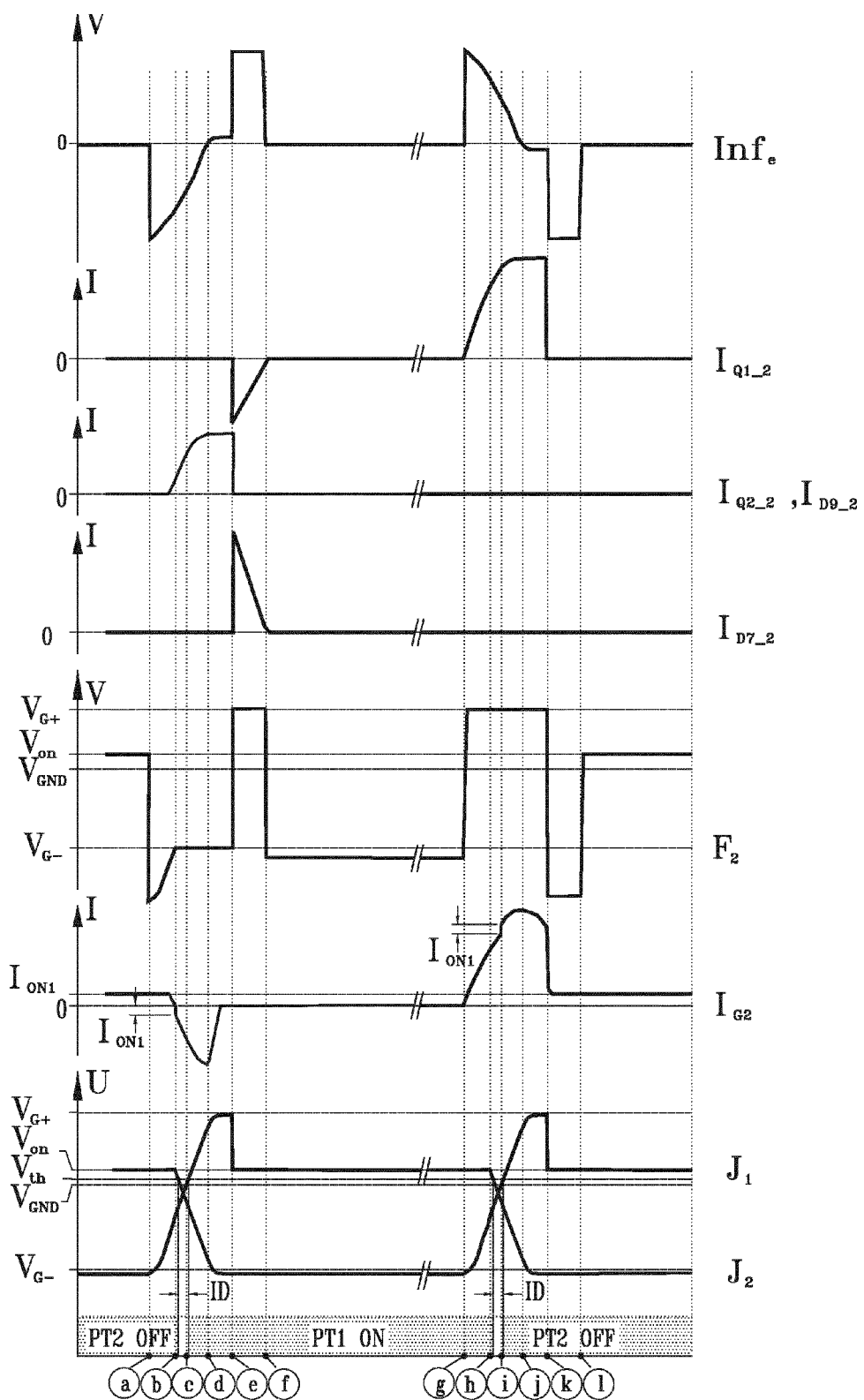
FIG. 18 show signal diagrams for illustrating the operation of driving circuits according to the present invention shown on FIGS. 14-15.

The FIGS. 17 and 18 show a response of the characteristic time curves with respect to the input signal A shown in the first time curve of the FIG. 17. The time markers a-l are equal for FIG. 17 and FIG. 18. The time markers a and g present the beginning of the switching. The time markers b and h present the time when the bistable circuit 9 turns off the current generator $I_{on}$. The time markers c and i represent the time when the bistable circuit 9 turns on the current generator $I_{on}$. The time markers d and j represent the time when the triggering switch Q2 stops conducting due to the drive signals $J_1$ and $J_2$ being equal to the negative DC gate supply voltage $V_{G-}$. The time markers e and k represent the time after the establishment time $t_e$ has expired. The time markers f and l represent the time when the energy return process is finished.

The second time curve of the FIG. 17 shows a signal diagram of the bipolar pulsed signal BC with a marked up establishment time $t_e$. The third time curve of the FIG. 17 shows a signal diagram of the current $I_{Q1\_1}$ of the triggering switch Q1 of the first triggering circuit $5_1$. The fourth time curve of the FIG. 17 shows a signal diagram of the current $I_{Q2\_1}$ of the triggering switch Q2 of the second triggering circuit $5_1$, which is equal to the current $I_{D9\_1}$ of the blocking diode $D_9$ of the same triggering circuit $5_1$. The fifth time curve of the FIG. 17 shows a signal diagram of the current $I_{D7\_1}$ of the capping diode $D_7$ of the first triggering circuit $5_1$. The sixth time curve of the FIG. 17 shows signal diagram of the first triggering signal $F_1$. The seventh time curve of the FIG. 17 shows signal diagram of the current $I_{G1}$ flowing to the control electrode of the first power switch PT1 with a marked up current $I_{ON1}$ of the current generator $I_{on}$. The eighth time curve of the FIG. 17 shows the signal diagram of the first drive signal $J_1$.

The first time curve of the FIG. 18 shows the signal diagram of the establishment time information $Inf_e$. The second time curve of the FIG. 18 shows the signal diagram of the current $I_{Q1\_2}$ of the triggering switch Q1 of the second triggering circuit $5_2$. The third time curve of the FIG. 18 shows the signal diagram of the current $I_{Q2\_2}$ of the triggering switch Q2 of the second triggering circuit $5_2$, which is equal to the current $I_{D9\_2}$ of the blocking diode $D_9$ of the same triggering circuit $5_2$. The fourth time curve of the FIG. 18 shows signal diagram of the current $I_{D7\_2}$ of the capping diode $D_7$ of the second triggering circuit $5_2$. The fifth time curve of the FIG. 17 shows signal diagram of the second triggering signal $F_2$. The sixth time curve of the FIG. 18 shows signal diagram of the current $I_{G2}$ flowing to the control electrode of the second power switch PT2 with a marked up current $I_{ON1}$ of the current generator $I_{on}$. The eighth time curve of the FIG. 17 shows the signal diagram of the drive signals $J_1$ and $J_2$ with a marked up interlock delay ID. The dot hatched area on the FIG. 18 shows the on and off states of the power switches PT1 and PT2.

Figure 19:
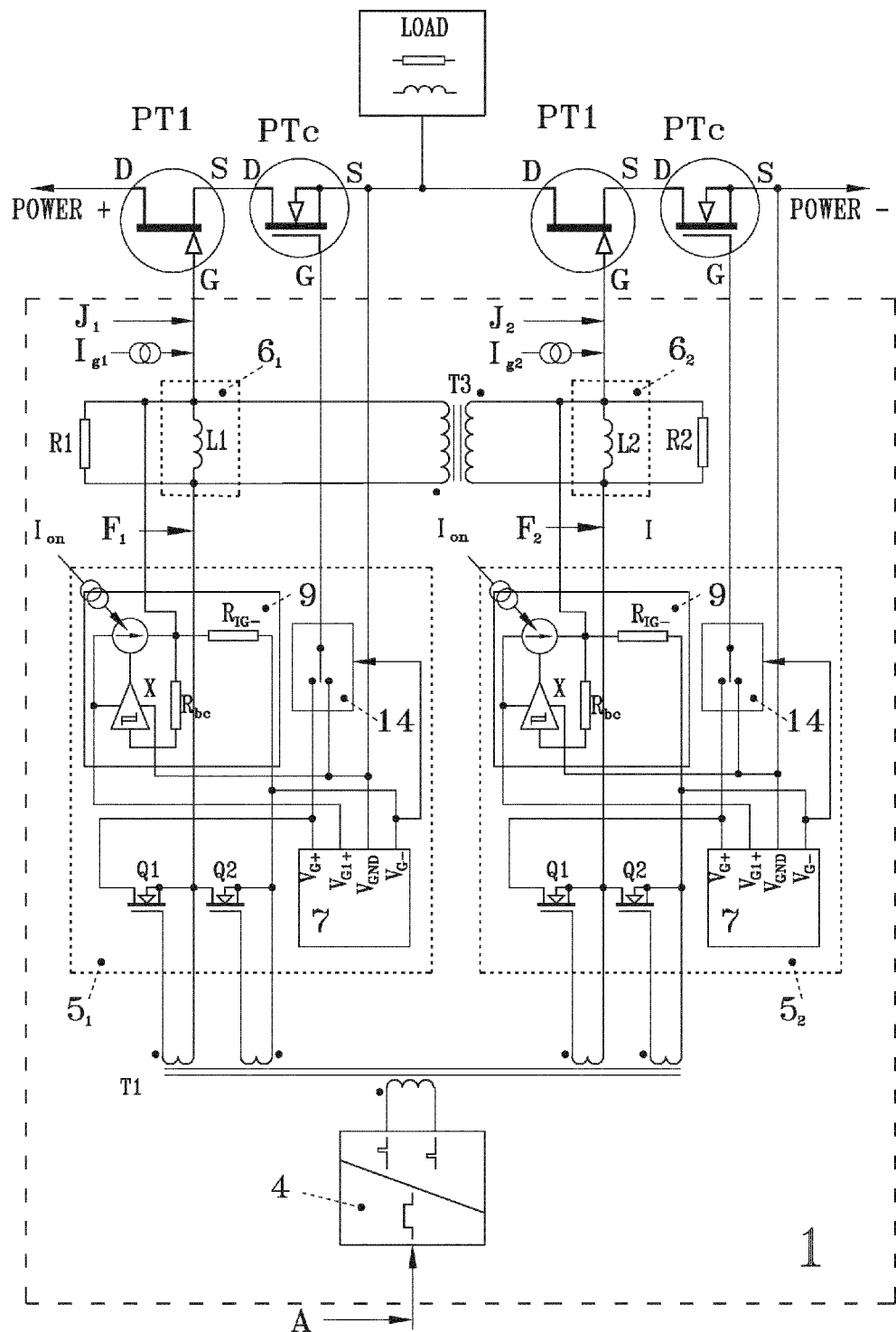
FIG. 19 shows a circuit diagram of a possible embodiment of driving circuit according to the present invention for driving a normally on JFET.

In a possible embodiment in FIG. 19 the driving circuit 1 controls normally on JFETs as power switches PT1 and PT2. In order to prevent the cross conduction through the power switches PT1 and PT2 in the time before and during the establishment of the operation conditions of the driving circuit 1 the cascode power switch PTc is connected in a cascode with the first power switch PT1 and a cascode power switch PTc connected with the second power switch PT2 is added. A cascode power switch PTc is formed by a low voltage and low on resistance MOSFET. The voltage of the cascode power switch PTc needs to be high enough to hold the power switch PT1 or PT2 in the cutoff region when the voltage on the control electrode G of the power switch PT1 or PT2 reaches a positive DC gate supply voltage $V_{G+}$. The on resistance of the cascode power switch PTc should be in a mΩ range in order for the cascode power switch PTc not to essentially contribute to the conductive losses of the half bridge HB. In the possible embodiment of FIG. 19 an off current generating resistor $R_{IG}$-substitutes the off current generator $I_{off}$ and a cascode switching circuit 14 is added to the triggering circuits $5_2$ and $5_2$ in order to control the cascode power switch PTc. The cascode switching circuit 14 ensures an off state of the cascode power switch PTc during the establishment of the operation conditions of the driving circuit 1 by holding the control electrode G of the cascode power switch PTc connected to the source S of the cascode power switch PTc. In the time when the DC gate supply circuit 7 has not yet established the final values of the DC gate supply voltages $V_{G+}$, $V_{G1+}$ and $V_{G-}$ the control electrode G of the power switch PT1 and PT2 is connected through the off current generating resistor $R_{IG-}$ to the DC gate supply voltage $V_{G-}$ and through the half wave rectifier $D_2$ and the corresponding secondary winding of the power supply magnetic circuit T2 back to the source S of the cascode power switch PTc. Thus, the current through the corresponding power switch PT1 or PT2 is blocked. When the negative DC gate supply voltage $V_{G-}$ has reached its nominal value the cascode switching circuit 14 turns the cascode power switch PTcon. The corresponding power switch PT1 or PT2 remains in the cutoff region despite the cascode power switch PTc being turned on as the voltage at the control electrode G of the corresponding power switch PT1 or PT2 remains lower than the threshold voltage $V_{th}$, namely at the level of the negative DC gate supply voltage $V_{G-}$.

Figure 20:
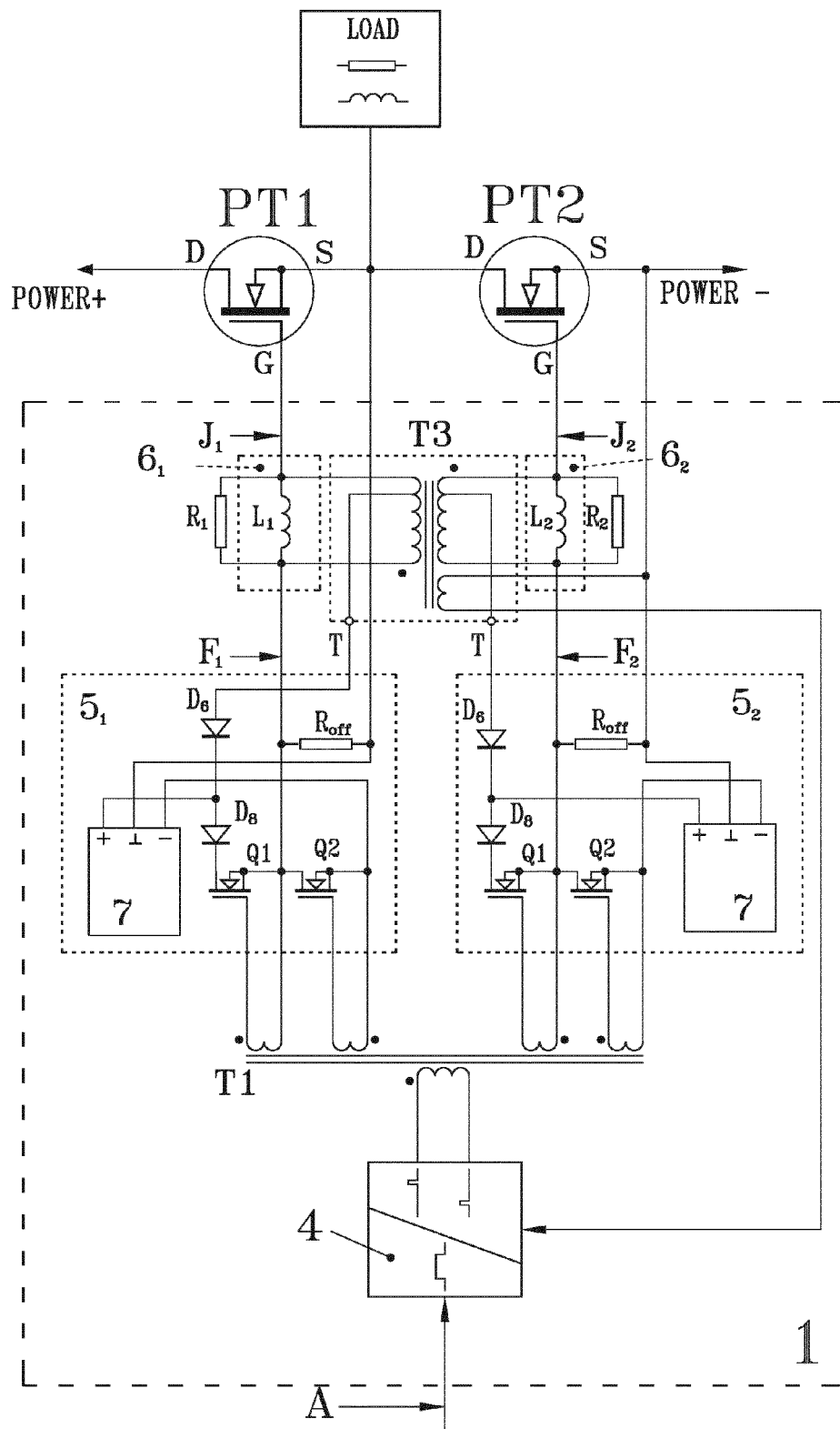
FIG. 20 shows a circuit diagram of a possible embodiment of driving circuit according to the present invention for driving a SiC FET.

In the possible embodiment of FIG. 20 SiC FETs are provided as power switches PT1 and PT2. SiC FETs are limited with a maximum negative voltage to a maximum negative driving voltage −10V, have the threshold voltage $V_{th}$ in the range up to 3V and need up to +20V to be completely in the ohmic region. A blocking diode $D_8$ and the only the capping diode $D_6$ is added to the triggering circuit $5_1$ and $5_2$. The DC gate supply voltage $V_{G-}$ is defined to be close to the maximum negative driving voltage, for example −8V for a −10V device limit. The mirroring voltage $V_m$ is defined to be within the cutoff region of the power switches PT1 and PT2. The positive DC gate supply voltage $V_{G+}$ is equal $V_m+(V_m-V_{G-})$, where $V_m$ presents the mirroring voltage and $V_{G-}$ presents the DC gate supply voltage $V_{G-}$. On state voltage $V_{on}$ is defined to be close to the maximum positive driving voltage, for example 20V for a −22V device limit with the autotransformer coupling ratio $R_{C<1}$ through the equation $(V_{G+}-V_{G-})/(V_{on}-V_{G-})$, where $V_{on}$ presents the on state voltage, $V_{G+}$ represents the positive DC gate supply voltage and $V_{G-}$ represents the negative DC gate supply voltage.

The driving energy $E_{L1}$ and $E_{L2}$ is in the possible embodiment of the FIG. 20 returned to the DC power supply circuit 7 of the triggering circuit $5_1$ or $5_2$ at the time of the corresponding power switch PT1, PT2 is switching on. The driving energy $E_{L1}$ and $E_{L2}$ is transferred through the magnetic coupling circuit T3 via the capping diode $D_6$ of the first triggering circuit $5_1$ connected to the corresponding tap T of the magnetic coupling circuit T3 and returned back to the DC gate supply circuit 7 of the first triggering circuit $5_1$ at the time when the power switch PT1 is in the switch on transition. The driving energy $E_{L1}$ and $E_{L2}$ is transferred through the magnetic coupling circuit T3 via the capping diode $D_6$ of the second triggering circuit $5_2$ connected to the corresponding tap T of the magnetic coupling circuit T3 and returned back to the DC gate supply circuit 7 of the second triggering circuit $5_2$ at the time when the power switch PT2 is in the switch on transition.

Figure 21:
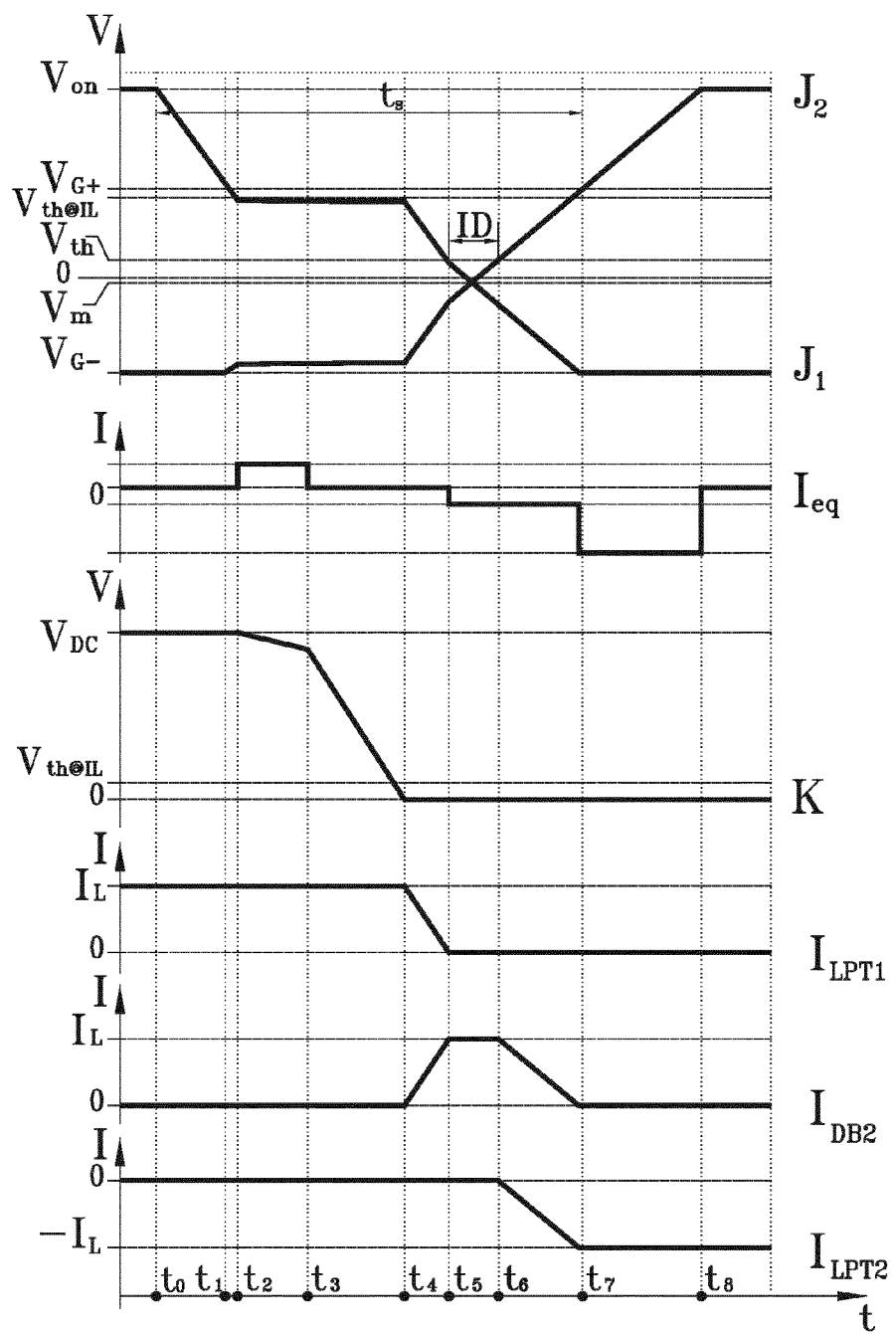
FIG. 21 show signal diagrams for illustrating the operation of driving circuits according to the present invention shown on FIG. 19.

FIG. 21 illustrates simplified time curves of a switch off transition of the first power switch PT1 and a switch on transition of the second power switch PT2. At time marking $t_0$ the triggering switch Q1 of the first triggering circuit $5_1$ and the triggering switch Q2 of the second triggering circuit $5_2$ is switched on. The first drive signal $J_1$ starts to drop. The second drive signal $J_2$ remains stable on the value of the off state voltage $V_{off}$ due to the blocking diode $D_8$. At the time marking $t_1$ the voltage on inductor L1 drops to a value $|V_{G-}|+V_{G+}$, where $V_{G-}$ presents the negative DC gate supply voltage and the $V_{G+}$ presents the positive DC gate supply voltage. The first drive signal $J_1$ starts to increase. At the time marking $t_2$ the first drive voltage $J_1$ reaches the load current threshold voltage $V_{th@IL}$ and the output voltage K starts to drop. The Miller effect becomes effective. The dropping in the output voltage K after time marking $t_3$ speeds up due to the reduction of the gate-drain capacity of the first power switch PT1 when the gate drain voltage of the first power switch PT1 overtakes the gate source voltage of the power switch PT1. The difference between the gate drain capacities of the power switches PT1 and PT2 causes an equalizing current $I_{eq}$ flowing through the magnetic coupling circuit T3 between the time markings $t_2$ and $t_3$. The load current $I_{LPT1}$ transfers from the FET cell FC of the first power switch PT1 to the body diode $D_B$ of the second power switch PT2 during the time when the first drive signal $J_1$ drops to the threshold voltage $V_{th}$ which is reached at the time marking $t_5$. The first power switch PT1 is off. At the time marking $t_6$ the second drive signal $J_2$ increases to the threshold voltage $V_{th}$. The load current $I_{LPT2}$ is transferred from the body diode $D_B$ to the FET cell FC of the second power switch PT2 between the time markings $t_6$ and $t_7$. The energy stored in the inductors $L_1$ and $L_2$ cause the second drive voltage $J_2$ to increase to on state voltage $V_{on}$ reached at the time marking $t_8$. The energy stored in the inductor $L_2$ is transferred to the gate source capacity of the second power switch PT2 through the magnetic coupling circuit T3. This energy transfer is shown by the equalizing current $I_{eq}$ flowing between the time markings $t_7$ and $t_8$.

The first time curve of FIG. 21 shows the signal diagram of the drive signals $J_1$ and $J_2$. The second time curve of the FIG. 21 shows the signal diagram of the equalizing current $I_{eq}$. The third time curve of FIG. 21 shows the signal diagram of the output signal K. The fourth time curve of FIG. 21 shows the signal diagram of the load current $I_{LPT1}$ flowing through the first power switch PT1. The fifth time curve of the FIG. 21 shows the signal diagram of the current flowing through the body diode $D_{B2}$ of the second power switch PT2. The sixth time curve of the FIG. 21 shows the signal diagram of the load current $I_{LPT2}$ of the second power switch PT2.

Figure 22:
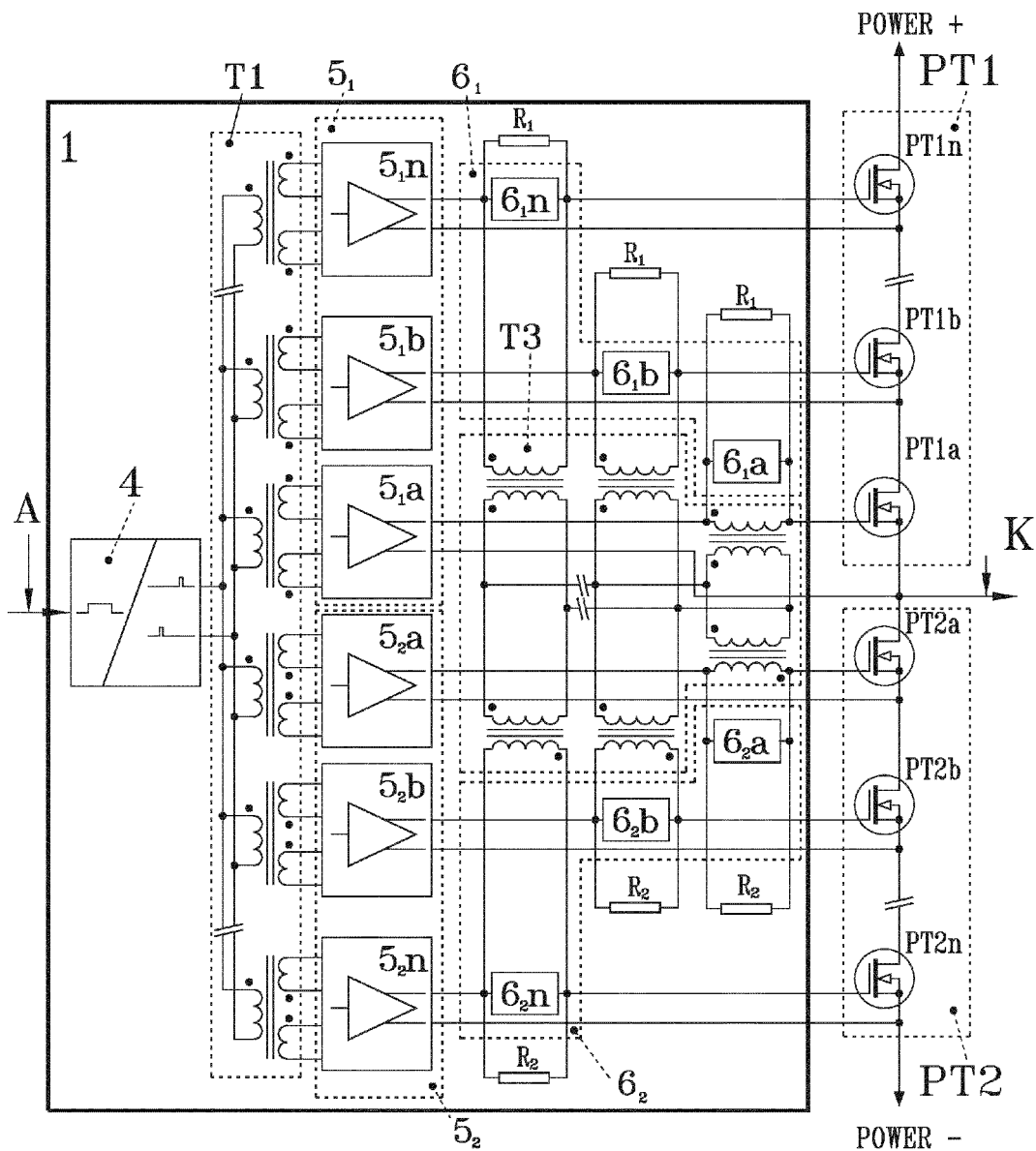
FIG. 22 shows a circuit diagram of serial connected power switches according to the present invention.

In the possible embodiment of FIG. 22 the first power switch PT1 consists of serially connected switching elements PT1a, PT1b . . . PT1n and the second power switches PT2 consists of serially connected switching elements PT2a, PT2b . . . PT2n. The first triggering circuit $5_1$ comprises triggering circuits $5_1$a, $5_1$b . . . $5_1$n and the second triggering circuit $5_2$ comprises triggering circuits $5_2$a, $5_2$b . . . $5_2$n. The triggering circuits $5_1$a, $5_1$b . . . $5_1$n, $5_2$a, $5_2$b . . . $5_2$n are driven with the magnetic triggering circuit T1. The magnetic triggering circuit T1 comprises six transformers each having one primary and two secondary winding. The first ramp generating circuit $6_1$ consists of $6_1$a, $6_1$b . . . $6_1$n and the second ramp generating circuit $6_2$ consists of $6_2$a, $6_2$b . . . $6_2$n. Each triggering circuit $5_1$a, $5_1$b . . . $5_1$n, $5_2$a, $5_2$b . . . $5_2$n is connected to a corresponding ramp generating circuit $6_1$a, $6_1$b . . . $6_1$n, $6_2$a, $6_2$b . . . $6_2$n being connected to the corresponding switching element PT1a, PT1b . . . PT1n, PT2a, PT2b . . . PT2n and comprising the inductor $L_1$. The resistor $R_1$ is connected in parallel to every ramp generating circuit $6_1$a, $6_1$b . . . $6_1$n, $6_2$a, $6_2$b . . . $6_2$n. The magnetic coupling circuit T3 consists of six transformers each having one of its windings connected to one of the ramp generating circuits $6_1$a, $6_1$b . . . $6_1$n, $6_2$a, $6_2$b . . . $6_2$n and the remaining windings connected in parallel between each other. A coupling ratio between the windings of magnetic coupling circuit T3 connected to any pair of the ramp generating circuits $6_1$a, $6_1$b . . . $6_1$n is 1 and a coupling ratio between windings of the magnetic coupling circuit T3 connected to any pair of the ramp generating circuits $6_2$a, $6_2$b . . . $6_2$n is 1. The coupling ratio between the windings of the magnetic coupling circuit T3 being connected to the ramp generating circuits $6_1$n and $6_2$n is −1.

Figure 23:
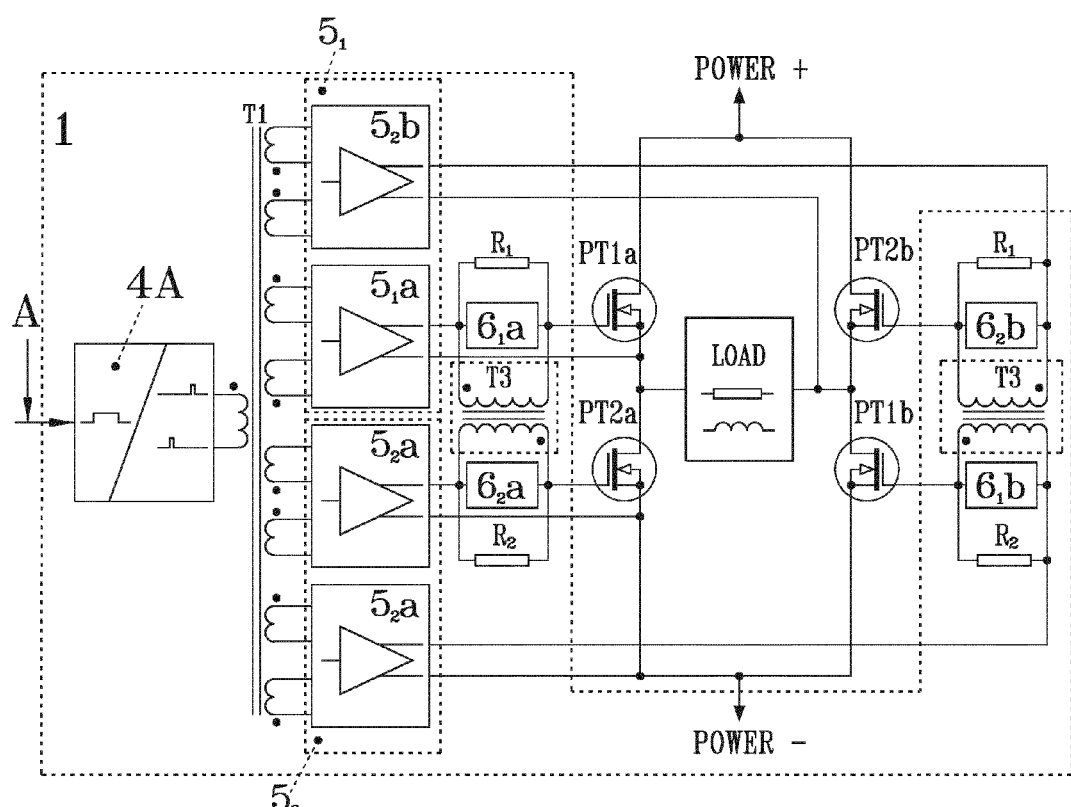
FIG. 23 shows a circuit diagram of the driving circuit according to the present invention for driving two half bridges.
Figure 24:
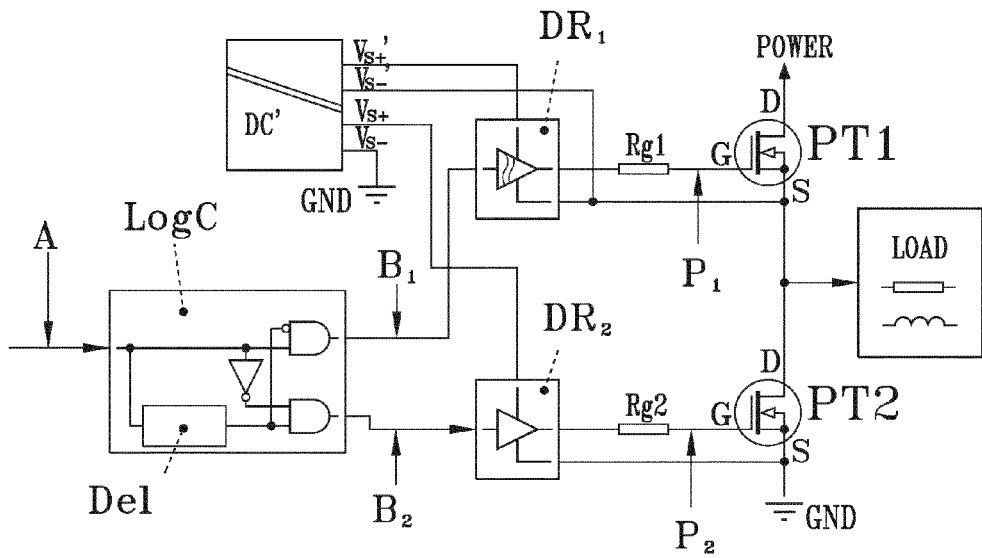
FIG. 24 shows a state of art driver.
Figure 25:
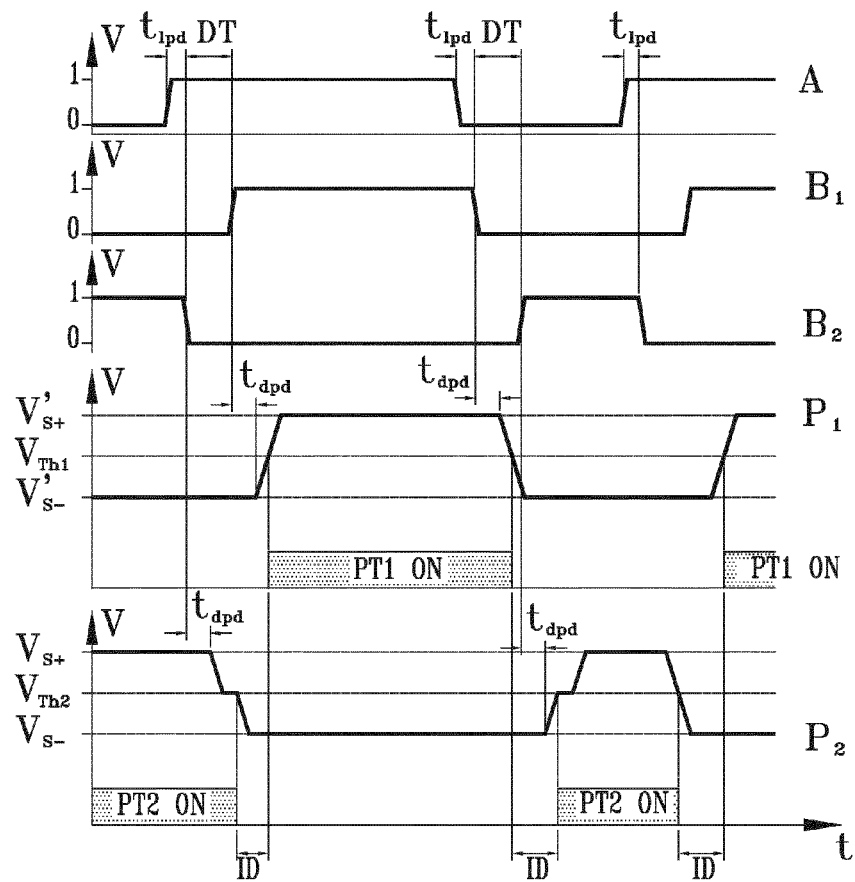
FIG. 25 shows a state of art driver.
Figure 26:
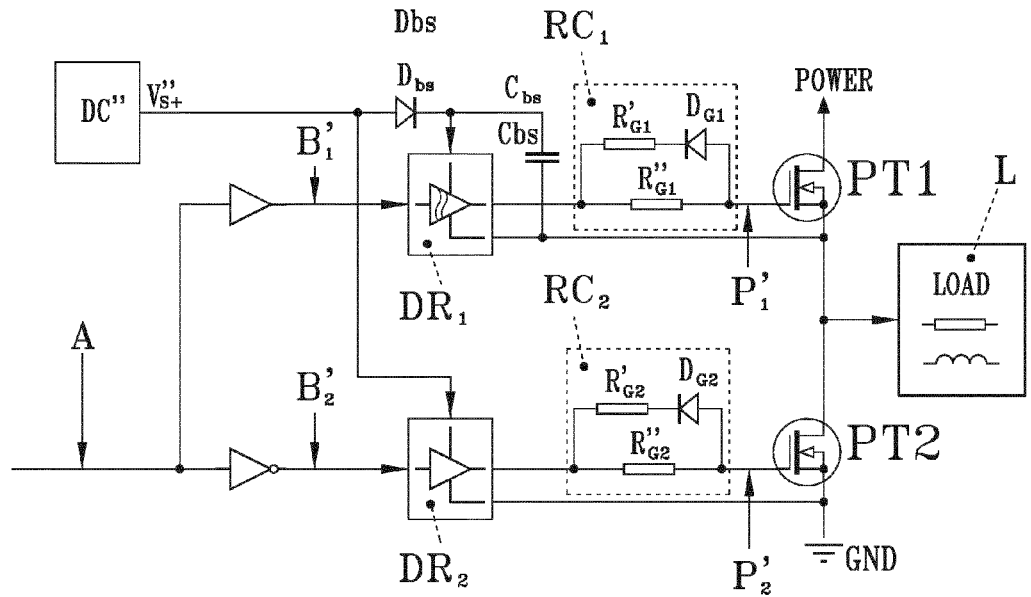
FIG. 26 shows a state of art driver.
Figure 27:
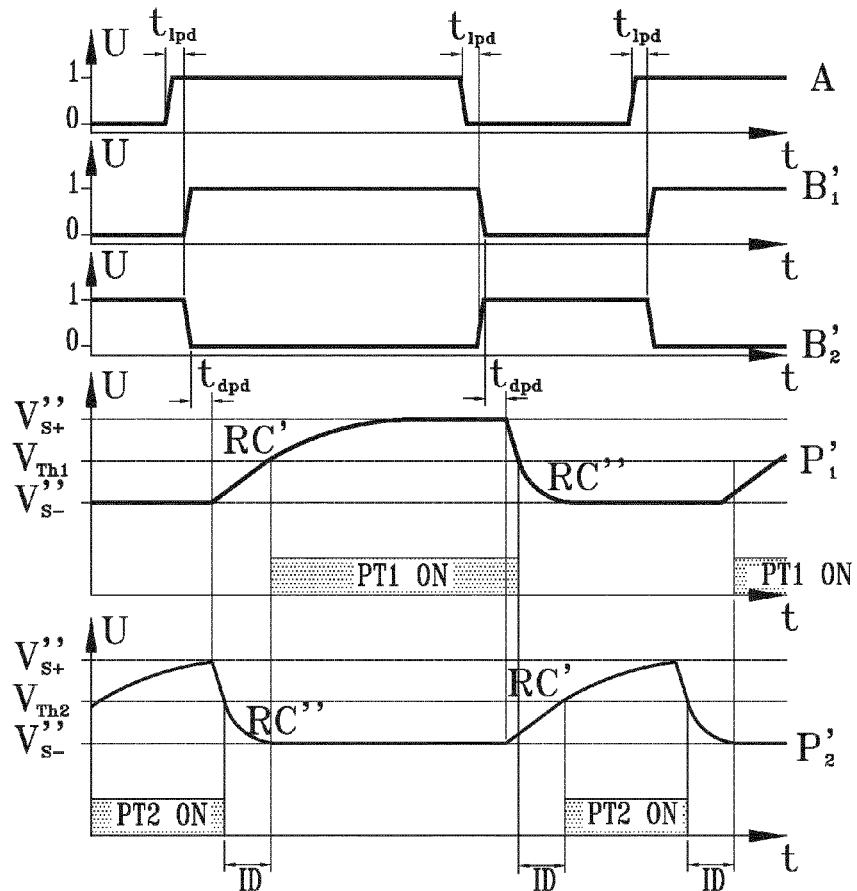
FIG. 27 shows a state of art driver.

In a possible embodiment of the FIG. 23 the driving circuit 1 according to the present invention controls the first power switch PT1, which consists of two switching elements PT1a and PT1b and the second power switch PT2, which consists of two switching elements PT2a and PT2b. The switching elements PT1a and PT2a are also connected in a half bridge and the switching elements PT1b and PT2b are connected in a half bridge. The switching elements PT1a and PT2b are powered with the power supply POWER+ and switching elements PT2a and PT1b are powered with the power supply POWER+. The load is connected between a common point of the switching elements PT1a and PT2b and a common point of the switching elements PT2a and PT1b. The magnetic triggering circuit T1 has one transformer with one primary and eight secondary windings.

The first triggering circuit $5_1$ consists of two triggering circuits $5_1$a and $5_2$b and the second triggering circuit $5_2$ consists of two triggering circuits $5_2$a and $5_1$b. The first ramp generating circuit $6_1$ consists of two ramp generating circuits $6_1$a and $6_2$b and the second ramp generating circuit $6_2$ consists of two ramp generating circuits $6_2$a and $6_1$b. The triggering circuit $5_1$a controls the switching element PT1a through the ramp generating circuit $6_1$a, the triggering circuit $5_2$a controls the switching element PT2a through the ramp generating circuit $6_2$a, the triggering circuit $5_1$b controls the switching element PT1b through the ramp generating circuit $6_1$b and the triggering circuit $5_2$b controls the switching element PT2b through the ramp generating circuit $6_2$b. A resistor $R_1$ is connected in parallel to the ramp generating circuits $6_1$a and $6_2$b. A resistor $R_2$ is connected in parallel to the ramp generating circuits $6_2$a and $6_1$b. The magnetic coupling circuit T3 is formed by two transformers each having windings connected in parallel to the ramp generating circuits $6_1$a, $6_2$a, $6_1$b and $6_2$b as shown in FIG. 23.

ABBREVIATIONS

NZID near zero interlock delay
ID interlock delay
DT dead time
PT power switch
PTc cascade power switch
PT1, PT2 power switches
PT1a, PT1b . . . PT1n switching elements of PT1
PT2a, PT2b . . . PT2n switching elements of PT2
HB half bridge
$D_B$ body diode
FC FET cell
S1 first step
S2 second step
A input signal
B, C pulsed signals
BC bipolar pulsed signal
$F_1$, $F_2$ triggering signals
$J_1$, $J_2$ drive signals
O signal
N gate power source voltage
M gate power ratio control signal
$B_1$, $B_2$ signals
$P_1$, $P_2$ signals B₁', B₂' signals
1 driving circuit
4 differentiating circuit
5₁, 5₂ triggering circuits
5₁a, 5₁b, . . . , 5₁n triggering circuits within 5₁
5₂a, 5₂b, . . . , 5₂n triggering circuits within 5₂
6₂, 6₂ ramp generating circuits
6₁a, 6₁b, . . . , 6₁n triggering circuits within 6₁
6₂a, 6₂b, . . . , 6₂n triggering circuits within 6₂
7 DC gate supply circuit
8 shut down circuit
9 bistable circuit
10 supply switching circuit
11 temperature influence adapting circuit
12 DC/DC converter
13 powering circuit
14 cascode switch control circuit
T1 magnetic triggering circuit
T2 power supply magnetic circuit
T3 magnetic coupling circuit
Del delay unit
$DR_1$, $DR_2$ galvanically isolated driving circuits
$RC_1$, $RC_2$ circuits
DC' power supply
$Inf_T$ temperature information
$Inf_n$ power switch state information
$Inf_{SD}$ shut down information
$Inf_e$ establishment time information
Q1, Q2 triggering switches
$L_1$, $L_2$ inductors
$R_1$, $R_2$ damping resistors
$D_6$, $D_7$ capping diodes
$D_8$, $D_9$ blocking diodes
$C_{GD}$ drain gate capacitor of power switch
$R_{ds\_onPT1}$ resistor
$R_{off}$ security resistor
$R_{bc}$ bistable circuit resistor
$R_{IG-}$ off current generating resistor
X comparator
$D_1$, $D_2$, $D_3$ half wave rectifiers
$C_1$, $C_2$, $C_3$ smoothing capacitors
SW1 switch
$C_5$ coupling capacitor
$R_{G1}$, $R_{G2}$ resistor
$D_{bs}$ bootstrap diode
$I_1$, $I_{LPT1}$, $I_{LPT2}$ load current
$I_{L1}$, $I_{L2}$ inductor current
$I_{R1}$, $I_{R2}$ resistor current
$I_{eq}$ equalizing current
$V_{G+}$ DC gate supply voltage
$V_{G-}$ DC gate supply voltage
$V_{GND}$ DC gate supply voltage
$V_{th@IL}$ load current threshold value
POWER+ power source voltage
POWER− power source voltage
$V_{th}$ threshold voltage
$V_{th@IL}$ load current threshold voltage
$V_{th@Tj}$ junction temperature threshold voltage
$V_m$ mirroring voltage
$V_{OS+}$, $V_{OS-}$ over sway magnitudes
$V_{thQ1}$, $V_{thQ2}$ bipolar threshold voltage
$V_{PT1on}$ PT1 on state voltage
$V_{PT2on}$ PT2 on state voltage
$V_{PT1off}$ PT1 off state voltage
$V_{PT2off}$ PT2 off state voltage
$V_{dif}$ voltage difference
$V_{Tr1}$, $V_{Tr2}$ magnitude
$V_{s+}'$, $V_{s-}'$, $V_{s+}$, $V_{s-}$ floating supply voltages
$t_{HLpd}$ high-to-low propagation delay
$t_{LHpd}$ low-to-high propagation delay
$t_s$ switching time
$t_t$ transition time
$t_e$ establishment time
$t_{op}$ operating period time
$t_{sd}$ shut down period time
$t_{lpd}$ logic propagation delay
$t_{dpd}$ driving propagation delay
G control electrode
S source
$A_{VD}$ voltage difference area
$A_H$ hysteresis area
$E_{L1}$, $E_{L2}$ driving energy
Φ1, Φ1', Φ2, Φ2' area
$R_{C<1}$ coupling ratio
T tap
T' tap
$T_j$ junction temperature
RC', RC" RC constant

The invention claimed is:

1. A driving circuit for at least one voltage controlled power switch device comprising:
   a driver signal generating circuit configured to receive a pulse width modulated signal and to generate logical pulse signals as:
      a first driver signal being generated as a logical signal having a first driver signal active state only during an on-state of said pulse width modulated signal, wherein said first driver signal active state occurs at least at every rising edge of said pulse width modulated signal and wherein said first driver signal active state has a duration of at least an establishment time;
      a second driver signal being generated as a logical signal having a second driver signal active state only during an off-state of said pulse width modulated signal, wherein said second driver signal active state occurs at least at every falling edge of said pulse width modulated signal and wherein said second driver signal active state has a duration of at least the establishment time, wherein a duration of the establishment time ensures a minimal driving power consumption of the driving circuit for driving the at least one voltage controlled power switch device; and
   at least one trigger signal generating circuit, each trigger signal generating circuit configured to generate a trigger signal for said at least one voltage controlled power switch device, said at least one trigger signal generating circuit comprising:
      a first driving transistor configured to be switched on during said first driver signal active state such that an on-voltage of the trigger signal is supplied to a control electrode of said at least one voltage controlled power switch device, and
      a second driving transistor configured to be switched on during said second driver signal active state such that an off-voltage of the trigger signal is supplied to the control electrode of said at least one voltage controlled power switch device.

2. The driving circuit for at least one voltage controlled power switch device according to claim 1, comprising:
   at least one energy buffer component comprising an inductivity coupled between the at least one trigger signal generating circuit and the control electrode of said at least one voltage controlled power switch device, wherein the at least one energy buffer component is adapted to:
store signal energy of the trigger signal until a threshold voltage of said at least one voltage controlled power switch device is reached and
to release the stored signal energy to said control electrode of said at least one voltage controlled power switch device when said threshold voltage of said power switch device has been reached, and
wherein the signal energy stored in said at least one energy buffer component provides a voltage overshoot at the control electrode of said at least one voltage controlled power switch device.

3. A driving circuit for driving half bridge connected electrically controlled power switches with a near zero interlock delay time between on-states of the power switches,
wherein the driving circuit is configured to receive an input signal and to generate:
a first drive signal, wherein said first drive signal controls a first power switch and is adapted to switch between an on-voltage and an off-voltage,
a second drive signal, wherein said second drive signal controls a second power switch and is adapted to switch between said on-voltage and said off-voltage,
wherein said on-voltage is deep in an ohmic region of said first power switch and said second power switch;
wherein said off-voltage is deep in a cutoff region of said first power switch and said second power switch;
wherein transition of said first drive signal and transition of said second drive signal start simultaneously with rising and falling edges of said input signal;
wherein a signal curve of said transition of said first drive signal and a signal curve of said transition of said second drive signal have complementary slopes;
wherein the signal curve of said first drive signal is mirrored with respect to said signal curve of said second drive signal along a mirroring voltage value level at least within a transition time; and
wherein the mirroring voltage value is adjusted to be within the cutoff region of the power switches.

4. The driving circuit according to claim 3, comprising:
at least one first trigger signal generating circuit,
at least one second trigger signal generating circuit,
at least one first ramp generating circuit and
at least one second ramp generating circuit.

5. The driving circuit according to claim 4,
wherein each trigger signal generating circuit comprises a pair of triggering switches,
wherein each pair of triggering switches of the first trigger signal generating circuit is adapted to generate a first triggering signal,
wherein each pair of triggering switches of the second trigger signal generating circuit is adapted to generate a second triggering signal.

6. The driving circuit according to claim 5,
wherein as a consequence of every odd logic change of the input signal a first triggering switch of said first trigger signal generating circuit changes the value of the first triggering signal stepwise from an off-voltage state to a positive DC gate supply voltage simultaneously with a second triggering switch of the second trigger signal generating circuit changing the value of the second triggering signal stepwise from an on-voltage state to a negative DC gate supply voltage, and
wherein as a consequence of every even logic change of the input signal a first triggering switch of the second trigger signal generating circuit changes the value of the second triggering signal stepwise from an off-voltage state to a positive DC gate supply simultaneously with a second triggering switch of the first trigger signal generating circuit changing the value of the first triggering signal stepwise from an on-voltage state to the negative DC gate supply voltage.

7. The driving circuit according to claim 6,
wherein each voltage step change of the first triggering signal is shaped into the first drive signal by forming a slope via the first ramp generating circuit and wherein each voltage step change of the second triggering signal is shaped into the second drive signal by forming a slope via the second ramp generating circuit.

8. The driving circuit according to claim 7,
wherein the first ramp generating circuit comprises an energy buffer component formed by a first inductivity connected between a common point of the pair of triggering switches of the first trigger signal generating circuit and a control electrode of the first power switch and wherein the second ramp generating circuit comprises an energy buffer component formed by a second inductivity connected between a common point of the pair of the triggering switches of the second trigger signal generating circuit and a control electrode of the second power switch.

9. The driving circuit according to claim 8,
wherein the first inductivity is adapted to supply a maximum current to the control electrode of the first power switch at the time when a threshold voltage of said first power switch is reached,
wherein a first driving energy stored in the first inductivity within a switching time is high enough to form a voltage overshoot on the control electrode of the first power switch in order to accelerate the switching of the first power switch,
wherein the second inductivity is adapted to supply a maximum current to the control electrode of the second power switch at the time when the threshold voltage of the second power switch is reached and
wherein the second driving energy stored in the second inductivity within a switching time is high enough to form a voltage overshoot on the control electrode of the second power switch which accelerates the switching of the second power switch.

10. The driving circuit according to claim 9,
wherein a first damping resistor is connected in parallel to the first inductivity and is adapted to damp a signal sway of the first driving signal and
wherein a second damping resistor is connected in parallel to the second inductivity and is adapted to damp a signal sway of the second driving signal.

11. The driving circuit according to claim 4,
wherein the driving circuit comprises a gate supply switching circuit and a power supply magnetic circuit,
wherein each trigger signal generating circuit comprises a DC gate supply circuit,
wherein said DC gate supply circuit comprises at least one half wave rectifier and at least one smoothing capacitor,
wherein each DC gate supply circuit is adapted to:
generate at least one positive DC gate supply voltage and a negative DC gate supply voltage and to
supply the first triggering switch with the positive DC gate supply voltage,
supply the second triggering switch with the negative DC gate supply voltage, and to receive energy from said power supply magnetic circuit wherein each DC gate supply voltage can have the value 0V, wherein said gate supply switching circuit is configured to:
  receive a gate power ratio control signal,
  receive a DC gate power source voltage, and to
  generate a signal adapted to carry a gate supply energy;

wherein said switching circuit adjusts the voltage value of the DC gate supply voltages output by the gate supply circuit by modulating the received DC gate power source voltage with PWM information of the received gate power ratio control signal, wherein said power supply magnetic circuit comprises at least one transformer and is adapted to provide a galvanic isolated energy transfer of said gate supply energy from the supply switching circuit to both DC gate supply circuits.

12. The driving circuit according to claim 11,
wherein the said driving circuit comprises a temperature influence adapting circuit adapted to:
  receive a temperature information signal carrying out a temperature information,
  generate said gate power ratio control signal,
  set the value of said DC gate power source voltage via a DC/DC converter and to
  set the gate power ratio control signal and the DC gate power source voltage with respect to the temperature information carried by the received temperature information signal such that the value of said DC gate supply voltages preserves a constant value of differential voltage over an entire temperature range of said temperature information signal.

13. The driving circuit according to claim 7,
wherein the mirroring between the driving signals is performed by a magnetic coupling circuit,
wherein said magnetic coupling circuit is connected between at least one first ramp generating circuit and at least one second ramp generating circuit,
wherein the magnetic coupling circuit comprises at least one transformer,
wherein said magnetic coupling circuit is adapted to perform a coupling ratio of plus one (+1) between any pair of the individual first ramp generating circuits,
wherein said magnetic coupling circuit is adapted to perform a coupling ratio of plus one (+1) between any pair of the individual second ramp generating circuits and
wherein said magnetic coupling circuit is adapted to perform a coupling ratio of minus one (−1) between said first ramp generating circuit and said second ramp generating circuit.

14. The driving circuit according to claim 13,
wherein the magnetic coupling circuit has a tap forming a coupling ratio less than one on at least one winding connected to said ramp generating circuit to form an autotransformer function,
wherein at least one of said trigger signal generating circuit comprises capping diodes connected to said tap,
wherein said magnetic coupling circuit is adapted for said coupling ratio of the magnetic coupling circuit to define a maximum voltage overshoot value on the control electrodes of the power switches and
wherein said magnetic coupling circuit and said capping diodes are adapted to return at least part of the driving energy back to the DC gate supply circuit via said capping diodes.

15. The driving circuit according to claim 3,
wherein the said driving circuit comprises a differentiating circuit and a magnetic triggering circuit having at least one transformer,
wherein the differentiating circuit is configured to receive the input signal and to generate a first and second pulsed signal,
wherein the pulsed signals both switch between an active and an inactive state and are adapted to control said pairs of said triggering switches through said magnetic triggering circuit without additional amplification of said pulsed signals,
wherein the value of the first pulsed signal is during the on state of said input signal set to an active state for an establishment time duration at least in response to each rising edge of the input signal and the value of the second pulsed signal is during the off state of the input signal set to an active state for said establishment time duration at least in response to each falling edge of said input signal,
wherein said establishment time has either a predetermined value or is defined simultaneously with respect to a power switch state information in order to ensure a minimal driving power consumption,
wherein said magnetic triggering circuit is adapted
to turn the first triggering switch of the first triggering circuit and the second triggering switch of the second triggering circuit on in response to an active state of the first pulsed signal and
to turn the second triggering switch of the first triggering circuit and the first triggering switch of the second triggering circuit on in response to an active state of the second pulsed signal and
to hold all triggering switches off if none of the pulsed signals is in an active state.

16. The driving circuit according to claim 4,
wherein said first triggering circuit comprises a bistable circuit adapted to prevent changes in the conducting state of the said power switch during the time when none of the triggering switches is switched on and
wherein said second triggering circuit comprises a bistable circuit adapted to prevent changes in the conducting state of the said power switch during the time when none of the triggering switches is switched on.

17. The driving circuit according to claim 4,
wherein at least one triggering circuit comprises a shut down circuit adapted to switch off the corresponding power switch in response to shut down information received through the signal carrying a gate supply energy.

18. The driving circuit according to claim 4,
wherein at least one of said trigger signal generating circuits comprises at least one blocking diode,
wherein said first blocking diode is connected between the DC gate supply circuit and the first triggering switch,
wherein a said second blocking diode is connected between the DC gate supply circuit and the second triggering switch.

19. The driving circuit according to claim 15,
wherein said differentiating circuit and the magnetic triggering circuit drive at least four power switches connected into a full bridge within the said driving circuit.

20. The driving circuit according to claim 3,
wherein said first power switch comprises at least one power switch element each controlled by drive signal and wherein said second power switch comprises at least one power switch element each controlled by a drive signal.

21. A method for driving half bridge connected electrically controlled power switches in terms of having a near zero interlock delay time between on-states of the power switches comprising the steps of:
generating a first and a second triggering signal,
wherein the first triggering signal changes as a response to every odd step change of an input signal its value in a step manner from an off-voltage state to a positive DC gate supply voltage simultaneously with the second triggering signal which changes its value in a step manner from an on-voltage state to a negative DC gate supply voltage end
wherein the first triggering signal changes as a response to every even step change of an input signal its value in a step manner from an on-voltage state to a negative DC gate supply voltage simultaneously with the second triggering signal which changes its value in a step manner from an off-voltage state to a positive DC gate supply voltage,
sloping said first and said second triggering signal to a first and a second drive signal with equal slopes as a response to the rising and falling edges of the input signal,
wherein said first and second drive signal are adapted to switch a corresponding power switch among the on and off state,
wherein said first and second drive signal are mirrored with respect to one another's time curve along the time axis through a mirroring voltage value within a transition time and
wherein the said mirroring voltage value is adjusted to be low enough for said power switches to be within a cutoff region.

* * * * *